US012652867B2

(12) United States Patent
Okumura et al.

(10) Patent No.: US 12,652,867 B2
(45) Date of Patent: Jun. 9, 2026

(54) METHOD FOR MANUFACTURING PHOTODETECTOR, AND PHOTODETECTOR

(71) Applicant: HAMAMATSU PHOTONICS K.K., Hamamatsu (JP)

(72) Inventors: Ryosuke Okumura, Hamamatsu (JP); Yuki Yoshida, Hamamatsu (JP); Yoshinori Tsukada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 368 days.

(21) Appl. No.: 17/310,780

(22) PCT Filed: Feb. 25, 2020

(86) PCT No.: PCT/JP2020/007509
§ 371 (c)(1),
(2) Date: Aug. 24, 2021

(87) PCT Pub. No.: WO2020/175483
PCT Pub. Date: Sep. 3, 2020

(65) Prior Publication Data
US 2022/0085095 A1 Mar. 17, 2022

(30) Foreign Application Priority Data
Feb. 26, 2019 (JP) ................................. 2019-032873

(51) Int. Cl.
*H10F 39/00* (2025.01)
*H10F 71/00* (2025.01)

(52) U.S. Cl.
CPC ......... *H10F 39/026* (2025.01); *H10F 39/028* (2025.01); *H10F 71/139* (2025.01)

(58) Field of Classification Search
CPC ......... H01L 27/14687; H01L 27/14632; H01L 27/14698; H01L 31/1892; H01L 27/1469; G01J 1/02
See application file for complete search history.

(56) References Cited

U.S. PATENT DOCUMENTS 8,456,856 B2* 6/2013 Lin ....................... H01L 23/481
361/783
2002/0036055 A1* 3/2002 Yoshimura .............. H01L 24/18
156/240

(Continued)

FOREIGN PATENT DOCUMENTS

CN 104795319 A 7/2015
CN 109313072 A 2/2019

(Continued)

OTHER PUBLICATIONS

International Preliminary Report on Patentability mailed Sep. 10, 2021 for PCT/JP2020/007509.

(Continued)

*Primary Examiner* — Shaun M Campbell
(74) *Attorney, Agent, or Firm* — Faegre Drinker Biddle & Reath LLP

(57) ABSTRACT

A method for manufacturing a light detection device includes a first process of preparing a semiconductor wafer having a first main surface and a second main surface, a second process of providing a first support substrate on the first main surface, a third process of cutting the semiconductor wafer and the first support substrate in a state where the first support substrate is provided on the first main surface, and obtaining a light receiving element in a state where a support member is provided on a first surface, a fourth process of, by using a plurality of connection members arranged between a second surface and a mounting surface of a circuit structure, electrically and physically (Continued)

connecting the light receiving element and the circuit structure in a state where the support member is provided on the first surface, and a fifth process of removing the support member from the first surface.

12 Claims, 24 Drawing Sheets

(56) References Cited

U.S. PATENT DOCUMENTS

| | | | | |
|---|---|---|---|---|
| 2004/0262732 | A1 * | 12/2004 | Noma | H01L 21/76898 |
| | | | | 257/E21.597 |
| 2011/0279717 | A1 * | 11/2011 | Wakiyama | H10F 39/803 |
| | | | | 257/459 |
| 2013/0203205 | A1 | 8/2013 | Murali et al. | |
| 2013/0285185 | A1 | 10/2013 | Park et al. | |
| 2015/0206916 | A1 * | 7/2015 | Lee | H01L 27/1469 |
| | | | | 438/65 |
| 2018/0308890 | A1 * | 10/2018 | Wang | H01L 27/14636 |
| 2019/0244924 | A1 * | 8/2019 | Zhang | H01L 24/11 |
| 2020/0058821 | A1 * | 2/2020 | Baba | H04N 25/79 |
| 2020/0144314 | A1 * | 5/2020 | Ganguly | H01L 27/14661 |
| 2020/0235155 | A1 * | 7/2020 | Sugiyama | H01L 27/1469 |
| 2020/0251516 | A1 * | 8/2020 | Miura | H04N 25/76 |
| 2021/0057477 | A1 * | 2/2021 | Takagi | H01L 24/16 |

FOREIGN PATENT DOCUMENTS

| | | | | |
|---|---|---|---|---|
| JP | 2008-210846 | A | 9/2008 | |
| JP | 2011-243612 | A | 12/2011 | |
| JP | 2013-042005 | A | 2/2013 | |
| JP | 2014-165224 | A | 9/2014 | |
| JP | 2015-508233 | A | 3/2015 | |
| JP | 2018-181957 | A | 11/2018 | |
| JP | 2020-136645 | A | 8/2020 | |
| WO | WO-03/096427 | A1 | 11/2003 | |
| WO | WO-2013/119513 | A1 | 8/2013 | |
| WO | WO-2018088479 | A1 * | 5/2018 | G01J 1/02 |

OTHER PUBLICATIONS

Watanabe, N. et al., "Fabrication of Back-Side Illuminated Complementary Metal Oxide Semiconductor Image Sensor Using Compliant Bump," Japanese Journal of Applied Physics, 2010, vol. 49, p. 04DB01-1-p. 04DB01-8.

* cited by examiner

METHOD FOR MANUFACTURING PHOTODETECTOR, AND PHOTODETECTOR

TECHNICAL FIELD

The present disclosure relates to a method for manufacturing a light detection device and a light detection device.

BACKGROUND ART

Non Patent Literature 1 describes a method for manufacturing a CMOS image sensor including a process of attaching a support tape to a photodiode array wafer, a process of dicing the photodiode array wafer together with the support tape and peeling the support tape from the photodiode array chip, and a process of mounting the photodiode array chip in a state where the support tape peeled off on a CMOS read circuit chip.

CITATION LIST

Non Patent Literature

Non Patent Literature 1: Naoya Watanabe and other four persons, "Fabrication of Back-Side Illuminated Complementary Metal Oxide Semiconductor Image Sensor Using Compliant Bump", Japanese Journal of Applied Physics 49 (2010), The Japan Society of Applied Physics, Apr. 20, 2010

SUMMARY OF INVENTION

Technical Problem

In the method for manufacturing the CMOS image sensor described in Non Patent Literature 1, as a light receiving element such as the photodiode array chip becomes thinner, handling of the light receiving element becomes difficult. As a result, there is concern that a defect may occur in connection between the light receiving element and a circuit structure such as the CMOS read circuit chip. Further, as the light receiving element such as the photodiode array chip becomes thinner, the light receiving element is easily deformed by an influence of stress, static electricity, etc. in the manufactured light detection device such as the CMOS image sensor, and as a result, there is concern that the light receiving element may come into contact with the circuit structure and damage the light receiving element.

An object of the present disclosure is to provide a method for manufacturing a light detection device capable of reliably connecting a light receiving element and a circuit structure even when the light receiving element is thinned, and a light detection device capable of preventing the light receiving element from being damaged due to deformation even when the light receiving element is thinned.

Solution to Problem

A method for manufacturing a light detection device of an aspect of the present disclosure includes a first process of preparing a semiconductor wafer having a first main surface and a second main surface on an opposite side from the first main surface, the semiconductor wafer including a plurality of light receiving regions two-dimensionally arranged, a second process of providing a first support substrate on the first main surface after the first process, a third process of cutting the semiconductor wafer and the first support substrate for each of the plurality of light receiving regions in a state where the first support substrate is provided on the first main surface, and obtaining a light receiving element corresponding to a part of the cut semiconductor wafer in a state where a support member corresponding to a part of the cut first support substrate is provided on a first surface corresponding to a part of the cut first main surface, after the second process, a fourth process of, by using a plurality of connection members arranged between a second surface corresponding to a part of the cut second main surface and a mounting surface of a circuit structure, electrically and physically connecting the light receiving element and the circuit structure in a state where the support member is provided on the first surface, after the third process, and a fifth process of removing the support member from the first surface after the fourth process.

In this method for manufacturing the light detection device, the semiconductor wafer and the first support substrate are cut for each of the plurality of light receiving regions in a state where the first support substrate is provided on the first main surface of the semiconductor wafer, the light receiving element and the circuit structure are electrically and physically connected in a state where the support member is provided on the first surface of the light receiving element, and then the support member is removed from the first surface of the light receiving element. In this way, when the light receiving element and the circuit structure are connected, the support member is provided on the first surface of the light receiving element. Therefore, even when the light receiving element is thinned, it is possible to prevent the light receiving element from becoming difficult to handle. Therefore, according to the method for manufacturing the light detection device, even when the light receiving element is thinned, the light receiving element and the circuit structure can be reliably connected to each other.

In the method for manufacturing the light detection device of the aspect of the present disclosure, the plurality of light receiving regions may be arranged two-dimensionally on a side of the second main surface with respect to a semiconductor substrate included in the semiconductor wafer. In this way, in the light receiving element, the light receiving regions are arranged on the circuit structure side with respect to the semiconductor substrate, and thus it is possible to obtain the light detection device including the back surface incident type light receiving element.

The method for manufacturing the light detection device of the aspect of the present disclosure may further include a sixth process of providing a second support substrate on the second main surface after the first process and before the second process, and a seventh process of thinning the semiconductor wafer in a state where the second support substrate is provided on the second main surface after the sixth process and before the second process, and in the second process, the first support substrate may be provided on the first main surface in a state where the second support substrate is provided on the second main surface, and the second support substrate may be removed from the second main surface in a state where the first support substrate is provided on the first main surface. In this way, the semiconductor wafer can be thinned in a stable state.

The method for manufacturing the light detection device of the aspect of the present disclosure may further include an eighth process of providing a plurality of bump electrodes as the plurality of connection members on the second main surface after the second process and before the third process.

In this way, the plurality of bump electrodes can be efficiently provided for each of the plurality of light receiving regions.

In the method for manufacturing the light detection device of the aspect of the present disclosure, the plurality of light receiving regions may be arranged two-dimensionally on a side of the first main surface with respect to a semiconductor substrate included in the semiconductor wafer. In this way, in the light receiving element, the light receiving regions are arranged on the opposite side from the circuit structure with respect to the semiconductor substrate, and thus it is possible to obtain the light detection device including the front surface incident type light receiving element.

The method for manufacturing the light detection device of the aspect of the present disclosure may further include a sixth process of thinning the semiconductor wafer in a state where the first support substrate is provided on the first main surface after the second process and before the third process. In this way, the semiconductor wafer can be thinned in a stable state.

The method for manufacturing the light detection device of the aspect of the present disclosure may further include a seventh process of providing a plurality of bump electrodes as the plurality of connection members on the second main surface after the sixth process and before the third process. In this way, the plurality of bump electrodes can be efficiently provided for each of the plurality of light receiving regions.

A light detection device of an aspect of the present disclosure includes a light receiving element having a first surface and a second surface on an opposite side from the first surface, and provided with a light receiving region, a circuit structure having a mounting surface, and a plurality of connection members arranged between the second surface and the mounting surface to electrically and physically connect the light receiving element and the circuit structure, in which a height of each of the plurality of connection members is larger than a width of the light receiving element in a direction perpendicular to the first surface.

In this light detection device, the height of each of the plurality of connection members electrically and physically connecting the light receiving element and the circuit structure is larger than the width of the light receiving element in the direction perpendicular to the first surface. In this way, even when the light receiving element is thinned and the light receiving element is easily deformed due to the influence of stress, static electricity, etc., the light receiving element is prevented from coming into contact with the circuit structure. Therefore, according to the light detection device, even when the light receiving element is thinned, it is possible to prevent the light receiving element from being damaged due to deformation.

In the light detection device of the aspect of the present disclosure, the height of each of the plurality of connection members may be twice or more the width of the light receiving element in the direction perpendicular to the first surface. In this way, even when the light receiving element is thinned, it is possible to more reliably prevent the light receiving element from coming into contact with the circuit structure.

In the light detection device of the aspect of the present disclosure, the height of each of the plurality of connection members may be five times or more the width of the light receiving element in the direction perpendicular to the first surface. In this way, even when the light receiving element is thinned, it is possible to more reliably prevent the light receiving element from coming into contact with the circuit structure.

In the light detection device of the aspect of the present disclosure, the plurality of connection members may be a plurality of bump electrodes. In this way, the light receiving element and the circuit structure can be reliably connected to each other while preventing the light receiving element from coming into contact with the circuit structure.

The light detection device of the aspect of the present disclosure may further include an underfill arranged between the second surface and the mounting surface. In this way, connection between the light receiving element and the circuit structure can be reinforced while protecting the plurality of bump electrodes.

In the light detection device of the aspect of the present disclosure, a width of the light receiving element in a direction parallel to the first surface may be 10 times or more a width of the light receiving element in a direction perpendicular to the first surface. In this way, even when the light receiving element is thinned and increased in area, it is possible to prevent the light receiving element from being damaged due to deformation.

Advantageous Effects of Invention

According to the present disclosure, it is possible to provide a method for manufacturing a light detection device capable of reliably connecting a light receiving element and a circuit structure even when the light receiving element is thinned, and a light detection device capable of preventing the light receiving element from being damaged due to deformation even when the light receiving element is thinned.

BRIEF DESCRIPTION OF DRAWINGS

FIG. 6 is a cross-sectional view illustrating a process of the method for manufacturing the light detection device illustrated in FIG. 1.

FIG. 10 is a cross-sectional view illustrating a process of the method for manufacturing the light detection device illustrated in FIG. 1.

FIG. 18 is a cross-sectional view illustrating a process of the method for manufacturing the light detection device illustrated in FIG. 14.

FIG. 19 is a cross-sectional view illustrating a process of the method for manufacturing the light detection device illustrated in FIG. 14.

DESCRIPTION OF EMBODIMENTS

Hereinafter, embodiments of the present disclosure will be described in detail with reference to the drawings. Note that in each figure, the same or corresponding parts are designated by the same reference symbols, and duplicate description will be omitted.

First Embodiment

[Configuration of Light Detection Device]

Figure 1:
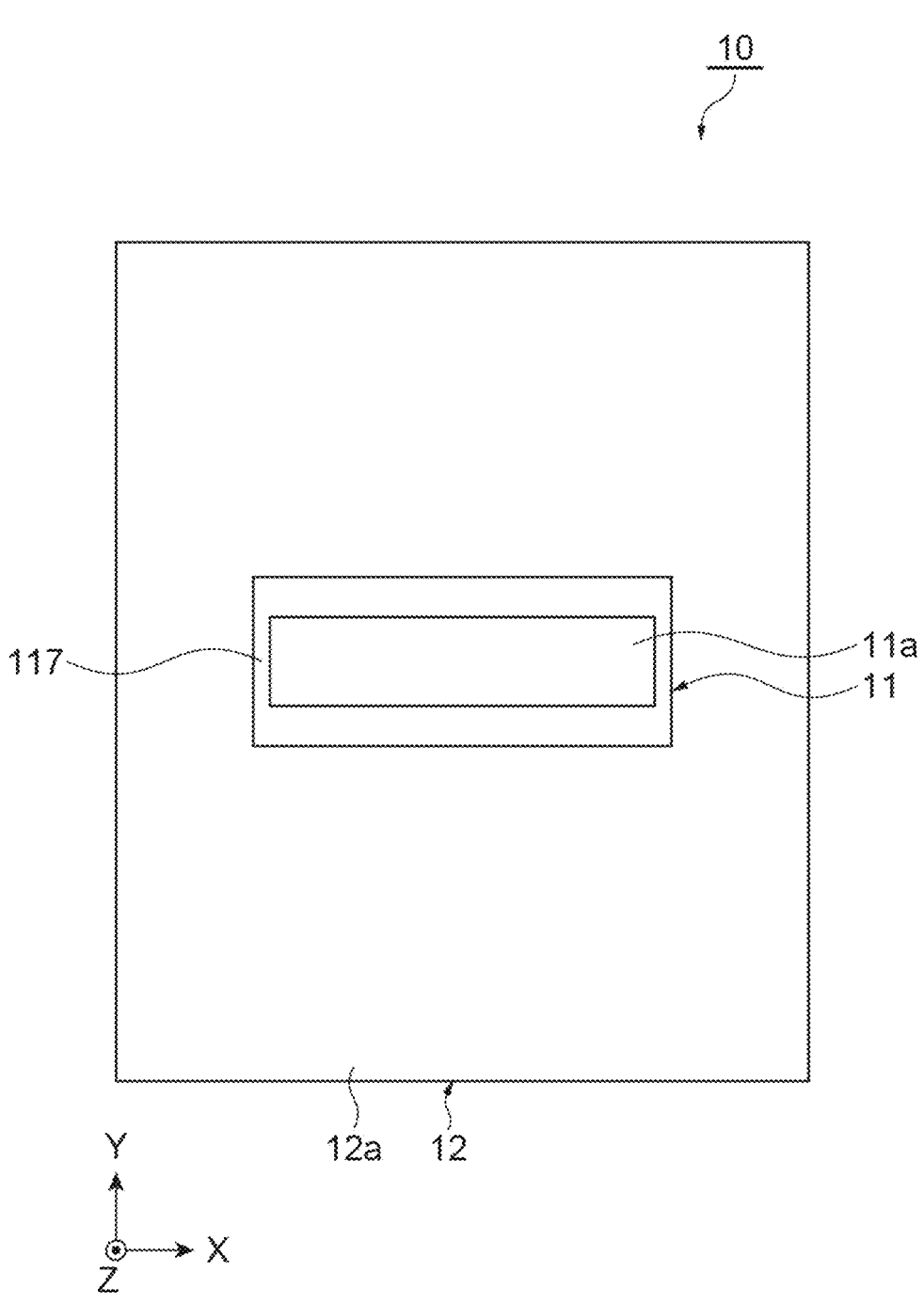
FIG. 1 is a plan view of a light detection device of a first embodiment.
Figure 2:
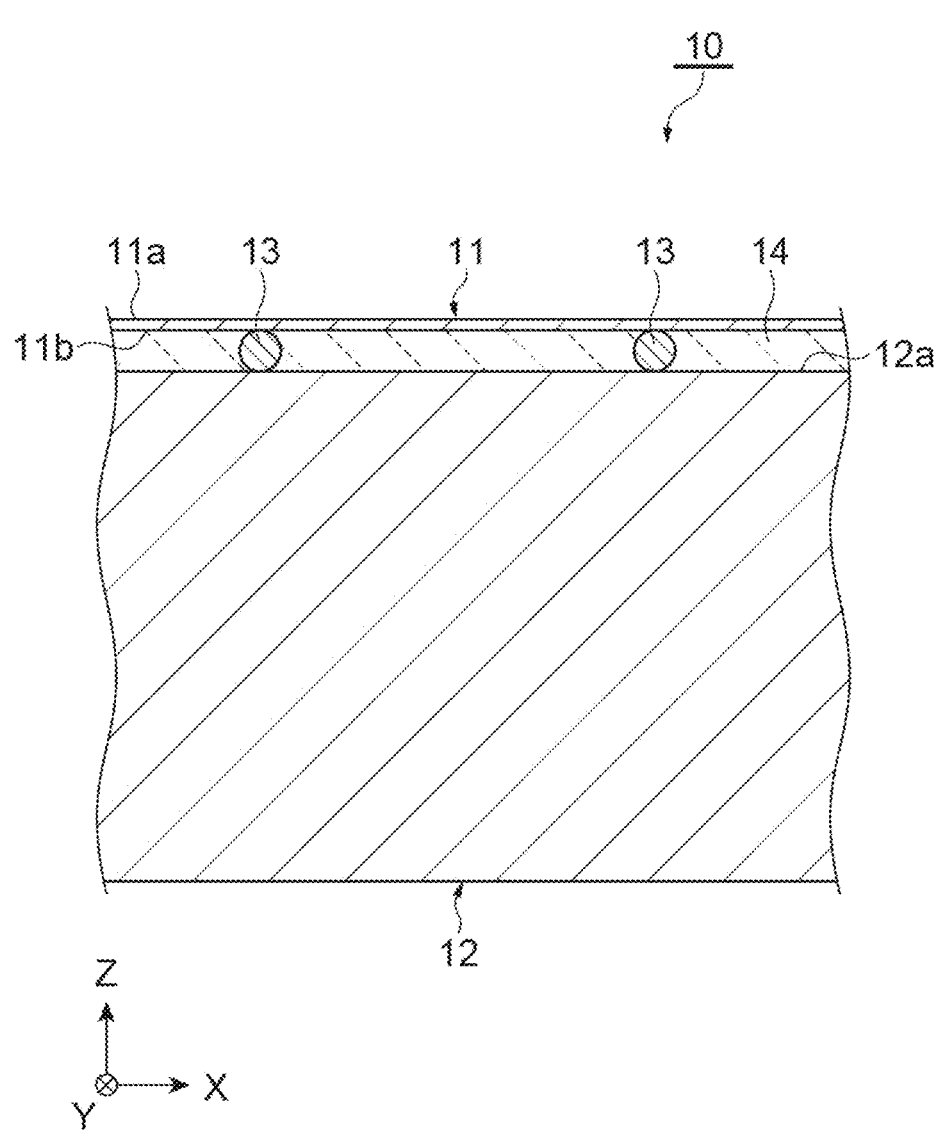
FIG. 2 is a cross-sectional view of a part of the light detection device illustrated in FIG. 1.

As illustrated in FIGS. 1 and 2, a light detection device 10 includes a light receiving element 11 and a circuit board (circuit structure) 12. The light receiving element 11 is mounted on the circuit board 12. The light receiving element 11 is a back surface incident type semiconductor light receiving element. For example, the light detection device 10 is included in a charge-coupled device (CCD) area sensor. In the following description, a direction of light incident on the light receiving element 11 is referred to as a Z-axis direction, a direction perpendicular to the Z-axis direction is referred to as an X-axis direction, and a direction perpendicular to the Z-axis direction and the X-axis direction is referred to as a Y-axis direction.

The light receiving element 11 has a back surface (first surface) 11a and a front surface (second surface) 11b. The front surface 11b is a surface on an opposite side from the back surface 11a. The light receiving element 11 is a back surface incident type semiconductor light receiving element having the back surface 11a as a light incident surface. A light-shielding member 117 that defines a light incident region is provided on the back surface 11a. For example, the light-shielding member 117 is formed in a rectangular frame shape using metal and extends along an outer edge portion of the back surface 11a.

For example, the light receiving element 11 is formed in a rectangular plate shape. A width of the light receiving element 11 in a direction parallel to the back surface 11a is 10 times or more a width of the light receiving element 11 in the Z-axis direction perpendicular to the back surface 11a (that is, a thickness of the light receiving element 11). Note that the width of the light receiving element 11 in the direction parallel to the back surface 11a means a minimum width among widths of the light receiving element 11 in all directions parallel to the back surface 11a. As an example, the width of the light receiving element 11 in the X-axis direction is about 50 mm, the width of the light receiving element 11 in the Y-axis direction is about 20 mm, and the thickness of the light receiving element 11 is about 15 μm. In this case, the width of the light receiving element 11 in the direction parallel to the back surface 11a is about 20 mm (the width of the light receiving element 11 in the Y-axis direction).

The circuit board 12 has a mounting surface 12a facing the front surface 11b of the light receiving element 11. For example, the circuit board 12 is formed in a rectangular plate shape. As an example, the width of the circuit board 12 in the X-axis direction is about 80 mm, the width of the circuit board 12 in the Y-axis direction is about 100 mm, and the width of the circuit board 12 in the Z-axis direction (that is, the thickness of the circuit board 12) is about 3 mm.

A plurality of bump electrodes (plurality of connection members) 13 is arranged between the front surface 11b of the light receiving element 11 and the mounting surface 12a of the circuit board 12. The plurality of bump electrodes 13 electrically and physically connects the light receiving element 11 and the circuit board 12. A height of each bump electrode 13 (that is, a distance between the front surface 11b of the light receiving element 11 and the mounting surface 12a of the circuit board 12) is larger than the thickness of the light receiving element 11. As an example, the height of each bump electrode 13 is about 40 μm. An underfill 14 is arranged between the front surface 11b of the light receiving element 11 and the mounting surface 12a of the circuit board 12. The underfill 14 surrounds each bump electrode 13 between the front surface 11b of the light receiving element 11 and the mounting surface 12a of the circuit board 12.

Figure 3:
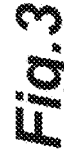
FIG. 3 is an enlarged cross-sectional view of a part of the light detection device illustrated in FIG. 1.
Figure 3:
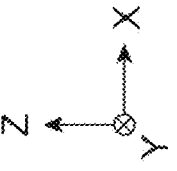

As illustrated in FIG. 3, the light receiving element 11 includes an n$^+$-type semiconductor substrate 111, an n$^-$-type semiconductor layer 112, a p$^-$-type semiconductor layer 113, and a plurality of p$^+$-type semiconductor regions 114. The semiconductor layer 112 is formed on the semiconductor substrate 111 by, for example, epitaxial growth. The semiconductor layer 113 is formed on the semiconductor layer 112 by, for example, epitaxial growth. The plurality of semiconductor regions 114 is formed inside the semiconductor layer 113, for example, by diffusion of impurities. The plurality of semiconductor regions 114 is arranged two-dimensionally (for example, in a matrix shape with the X-axis direction as a row direction and the Y-axis direction as a column direction) when viewed in the Z-axis direction. In the light receiving element 11, the semiconductor substrate 111 is located on the back surface 11a side, and the semiconductor layer 113 and the plurality of semiconductor regions 114 are located on the front surface 11b side. An anti-reflection (AR) film 118 is formed on the front surface of the semiconductor substrate 111 on the back surface 11a side.

In the light receiving element 11, the semiconductor layer 112 and the semiconductor layer 113 form a pn junction and are included in a light receiving region 11R that functions as a photoelectric conversion region. The light receiving region 11R is located on the front surface 11b side with respect to the semiconductor substrate 111. A part of the light receiving region 11R corresponding to each semiconductor region 114 is included in a pixel. An electrode pad 116 is provided on the front surface 11b for each semiconductor region 114. Each electrode pad 116 is electrically connected to the corresponding semiconductor region 114. The bump electrode 13 electrically and physically connects the electrode pad 116 of the light receiving element 11 and the electrode pad (not illustrated) of the circuit board 12 facing each other in the Z-axis direction. Note that the p-type and n-type conductive types in the light receiving element 11 may be the opposite of those described above.

[Method for Manufacturing Light Detection Device]

Figure 4:
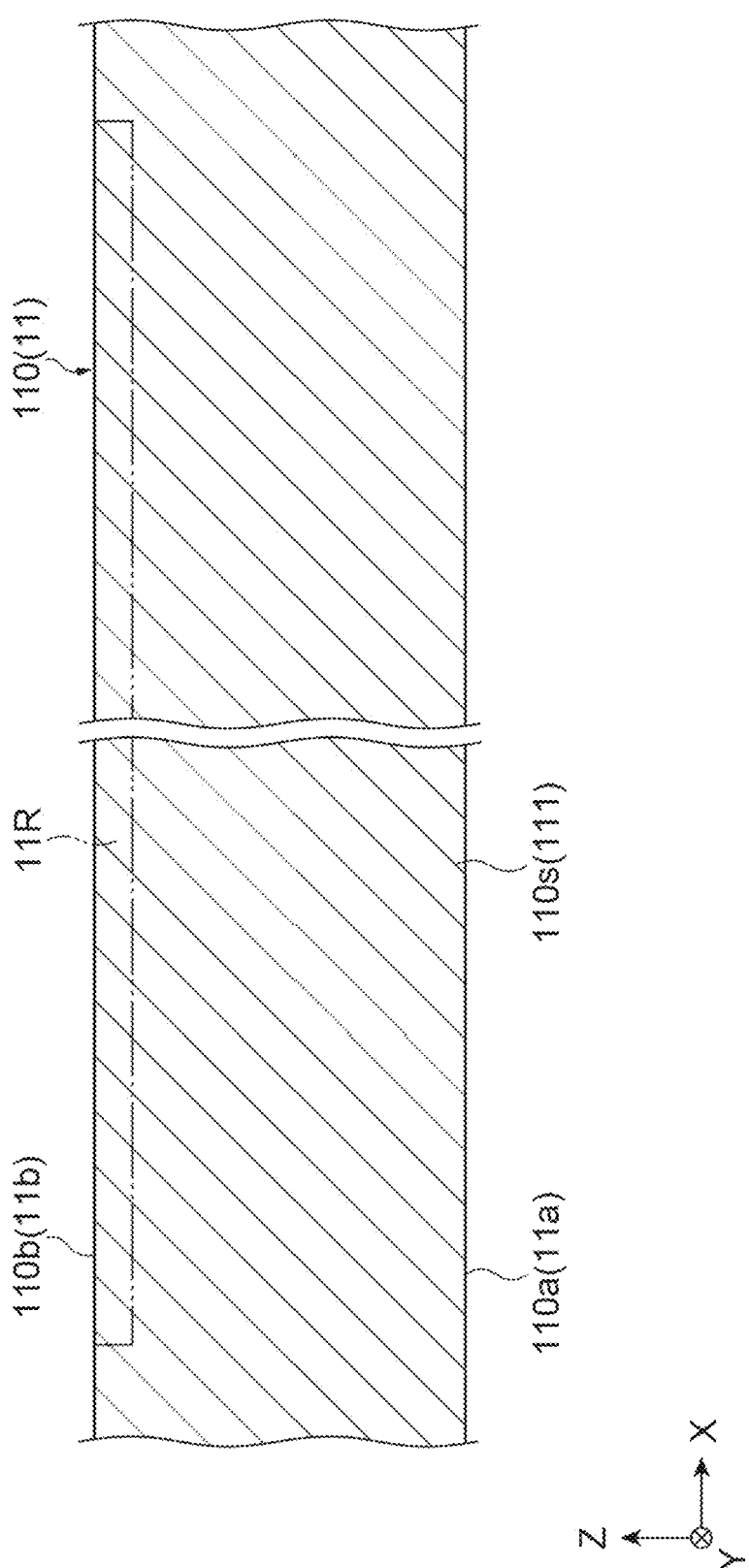
FIG. 4 is a cross-sectional view illustrating a process of a method for manufacturing the light detection device illustrated in FIG. 1.

First, as illustrated in FIG. 4, a semiconductor wafer 110 is prepared (first process). The semiconductor wafer 110 has a first main surface 110a and a second main surface 110b. The second main surface 110b is a surface on the opposite side from the first main surface 110a. The semiconductor wafer 110 includes a plurality of light receiving regions 11R. The plurality of light receiving regions 11R is arranged two-dimensionally on the second main surface 110b side with respect to a semiconductor substrate 110s included in the semiconductor wafer 110. That is, the semiconductor wafer 110 includes a plurality of light receiving elements 11 corresponding to the plurality of light receiving regions 11R, respectively. Note that FIG. 4 illustrates a part of the semiconductor wafer 110 corresponding to one light receiving region 11R.

Figure 5:
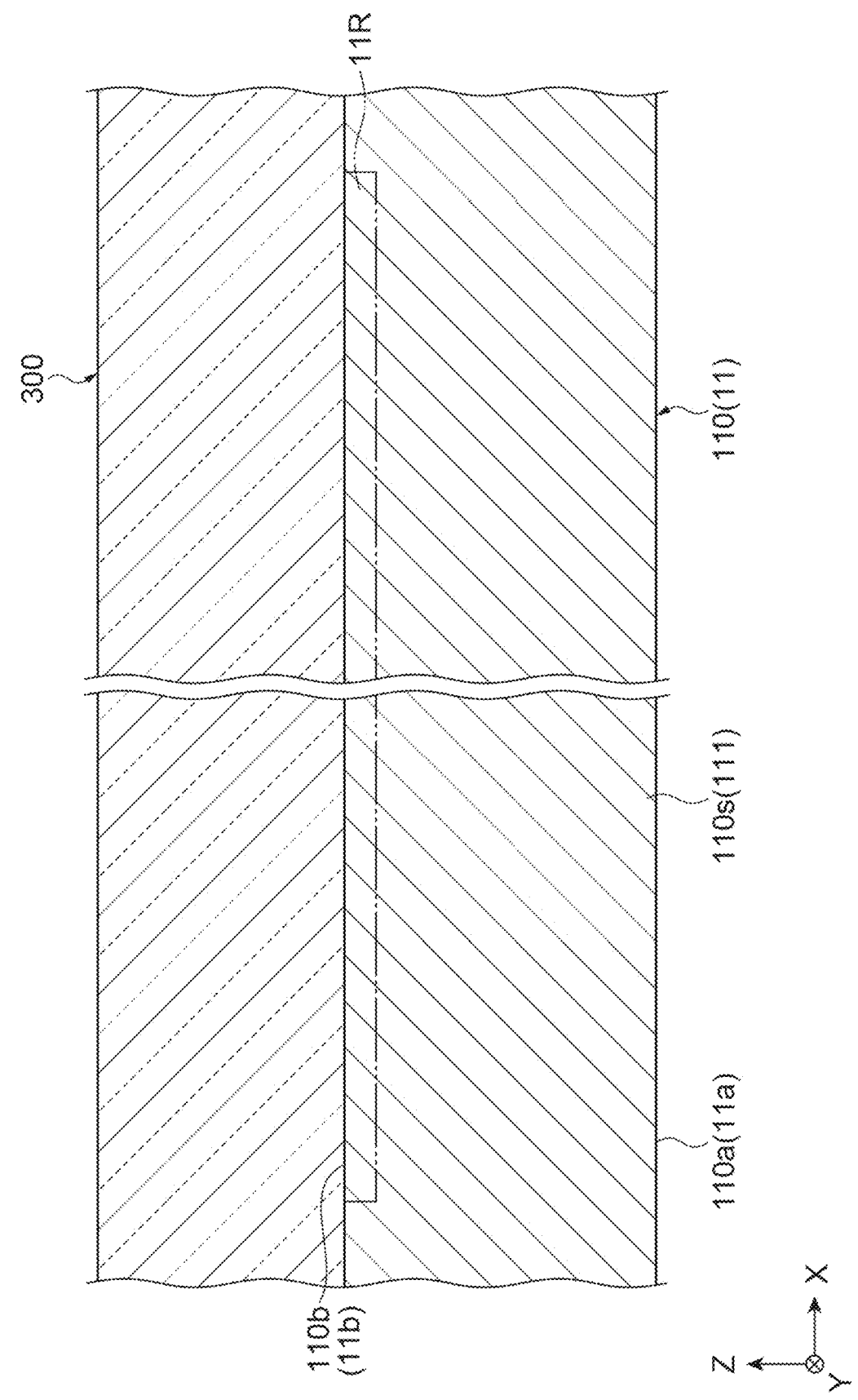
FIG. 5 is a cross-sectional view illustrating a process of the method for manufacturing the light detection device illustrated in FIG. 1.

Subsequently, as illustrated in FIG. 5, a support substrate (second support substrate) 300 is provided on the second main surface 110b of the semiconductor wafer 110 (sixth process). The support substrate 300 is, for example, a glass substrate. The support substrate 300 is fixed to the second main surface 110b of the semiconductor wafer 110 using, for example, an adhesive.

Figure 6:
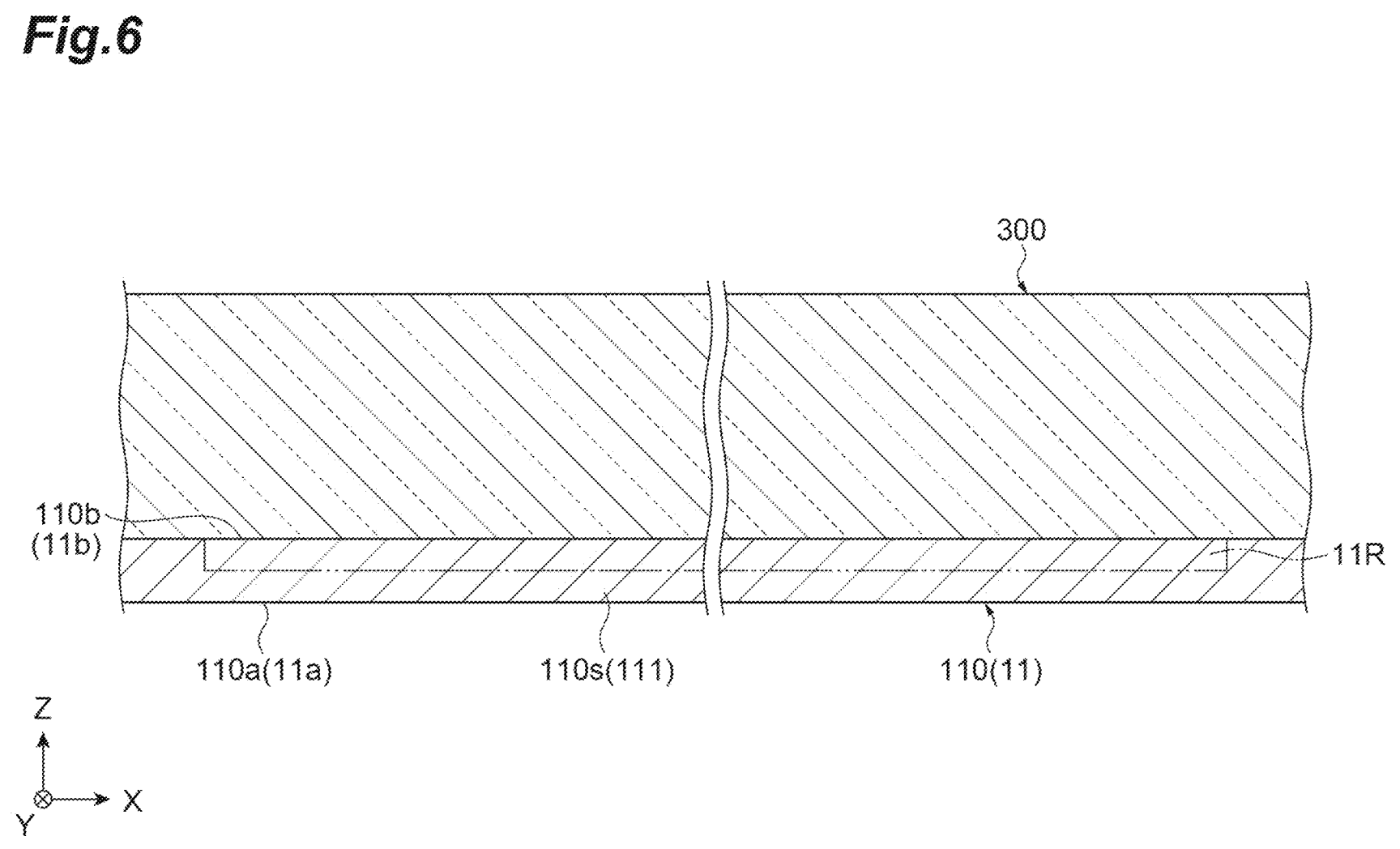

Subsequently, as illustrated in FIG. 6, the semiconductor wafer 110 is thinned in a state where the support substrate 300 is provided on the second main surface 110b (seventh process). The semiconductor wafer 110 is thinned, for example, by polishing the first main surface 110a. Subsequently, a film to be the AR film 118 is formed on the first main surface 110a, and a member to be the light-shielding member 117 is formed on the film (not illustrated).

Figure 7:
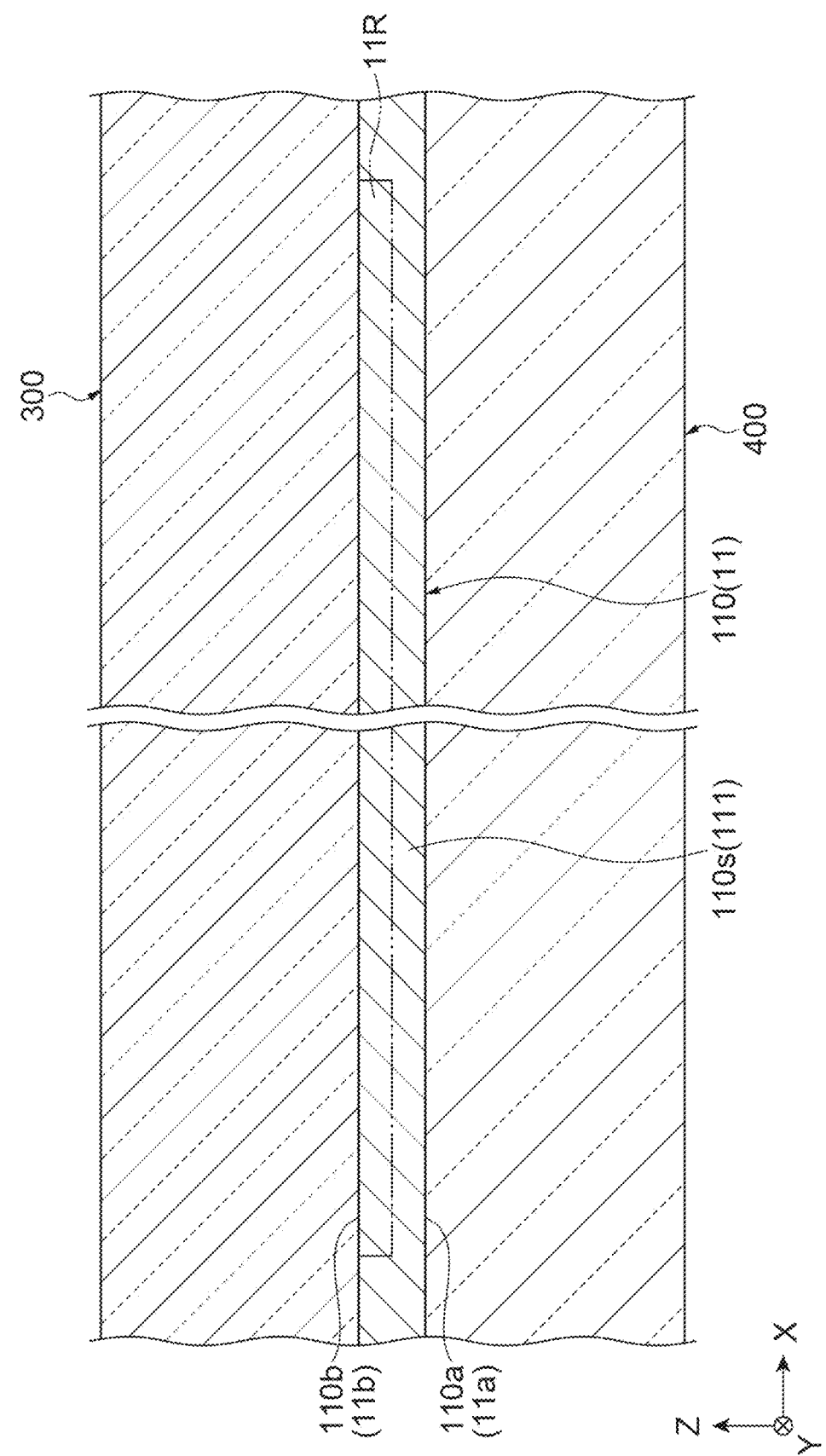
FIG. 7 is a cross-sectional view illustrating a process of the method for manufacturing the light detection device illustrated in FIG. 1.
Figure 8:
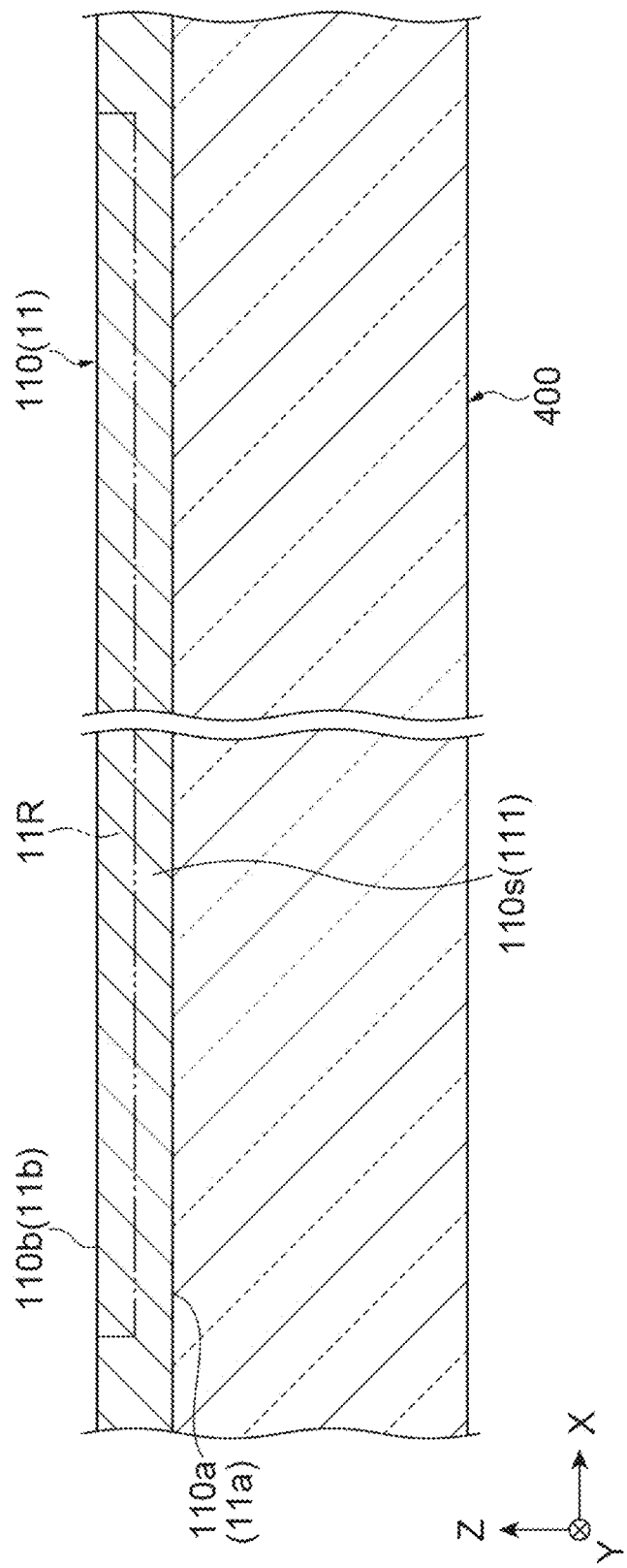
FIG. 8 is a cross-sectional view illustrating a process of the method for manufacturing the light detection device illustrated in FIG. 1.

Subsequently, as illustrated in FIGS. 7 and 8, the support substrate (first support substrate) 400 is provided on the first main surface 110a in a state where the support substrate 300 is provided on the second main surface 110b, and the support substrate 300 is removed from the second main surface 110b in a state where the support substrate 400 provided on the first main surface 110a. In this way, the support substrate 400 is provided on the first main surface 110a of the semiconductor wafer 110 (second process). The support substrate 400 is, for example, a glass substrate. The support substrate 400 is fixed to the first main surface 110a of the semiconductor wafer 110 using, for example, an adhesive. The support substrate 300 is peeled off from the second main surface 110b when adhesive strength of the adhesive arranged between the semiconductor wafer 110 and the support substrate 300 is reduced by, for example, light irradiation, heating, dissolution using a chemical solution, decomposition using a dry process (gas), etc. Note that the adhesive remaining on the second main surface 110b of the semiconductor wafer 110 is removed from the second main surface 110b by, for example, dissolution using a chemical solution, decomposition using a dry process, peeling using a tape, etc.

Figure 9:
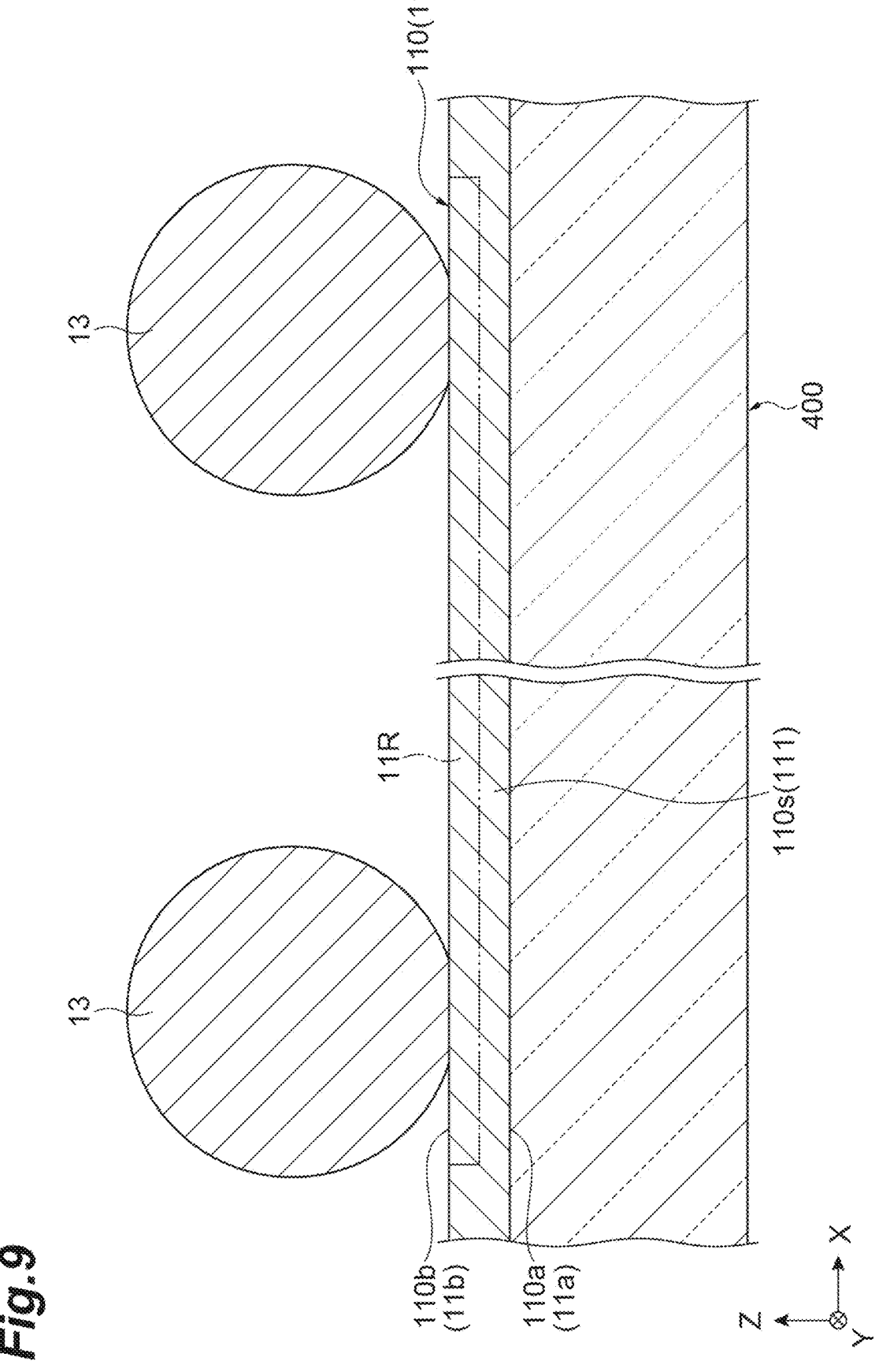
FIG. 9 is a cross-sectional view illustrating a process of the method for manufacturing the light detection device illustrated in FIG. 1.

Subsequently, as illustrated in FIG. 9, the plurality of bump electrodes 13 is provided on the second main surface 110b of the semiconductor wafer 110 (eighth process). In each light receiving region 11R, each bump electrode 13 is formed on each electrode pad 116 (see FIG. 3).

Figure 10:
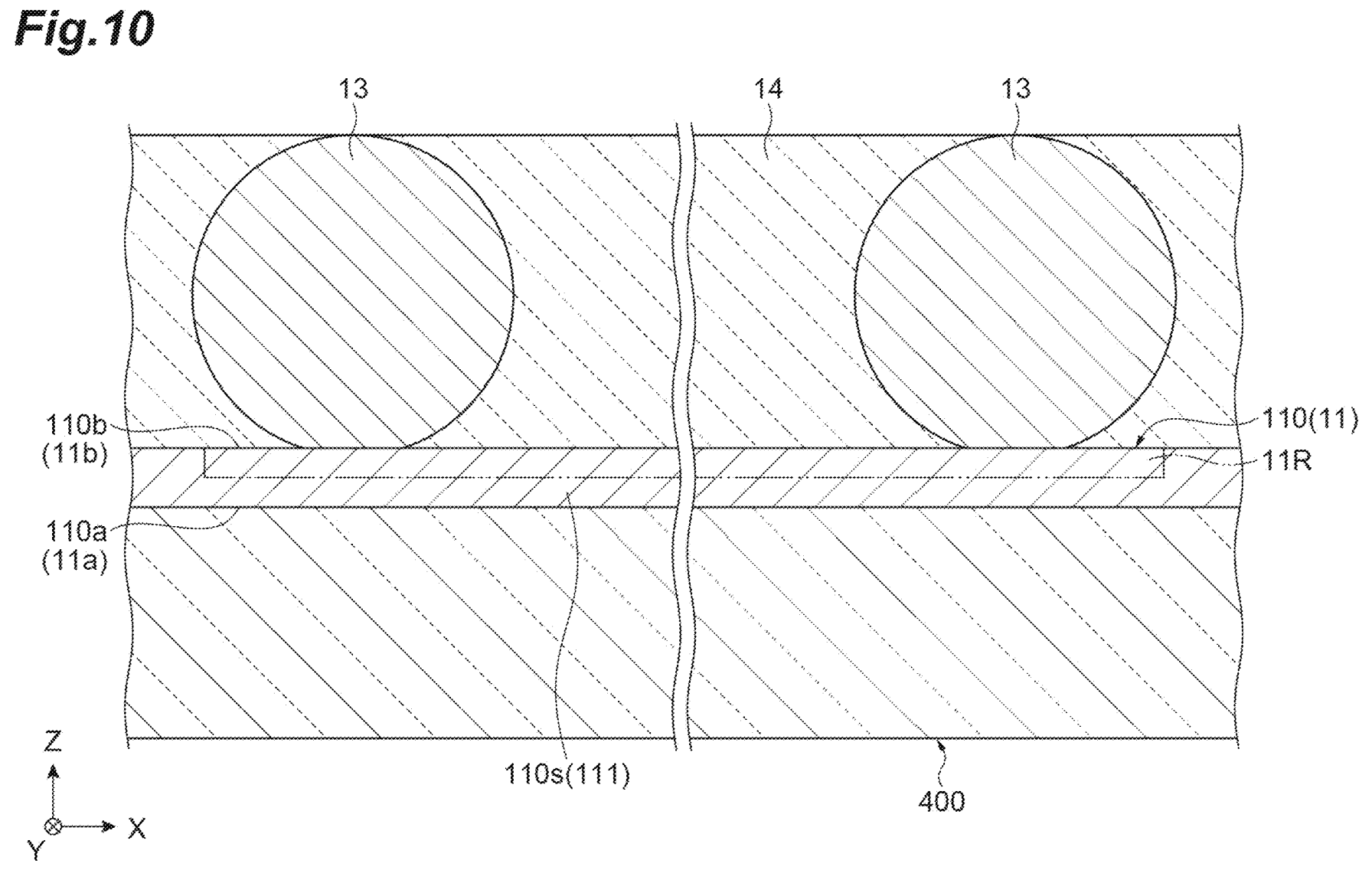

Subsequently, as illustrated in FIG. 10, the underfill 14 is arranged on the second main surface 110b so as to cover the plurality of bump electrodes 13. The underfill 14 is, for example, a film-shaped resin film.

Figure 11:
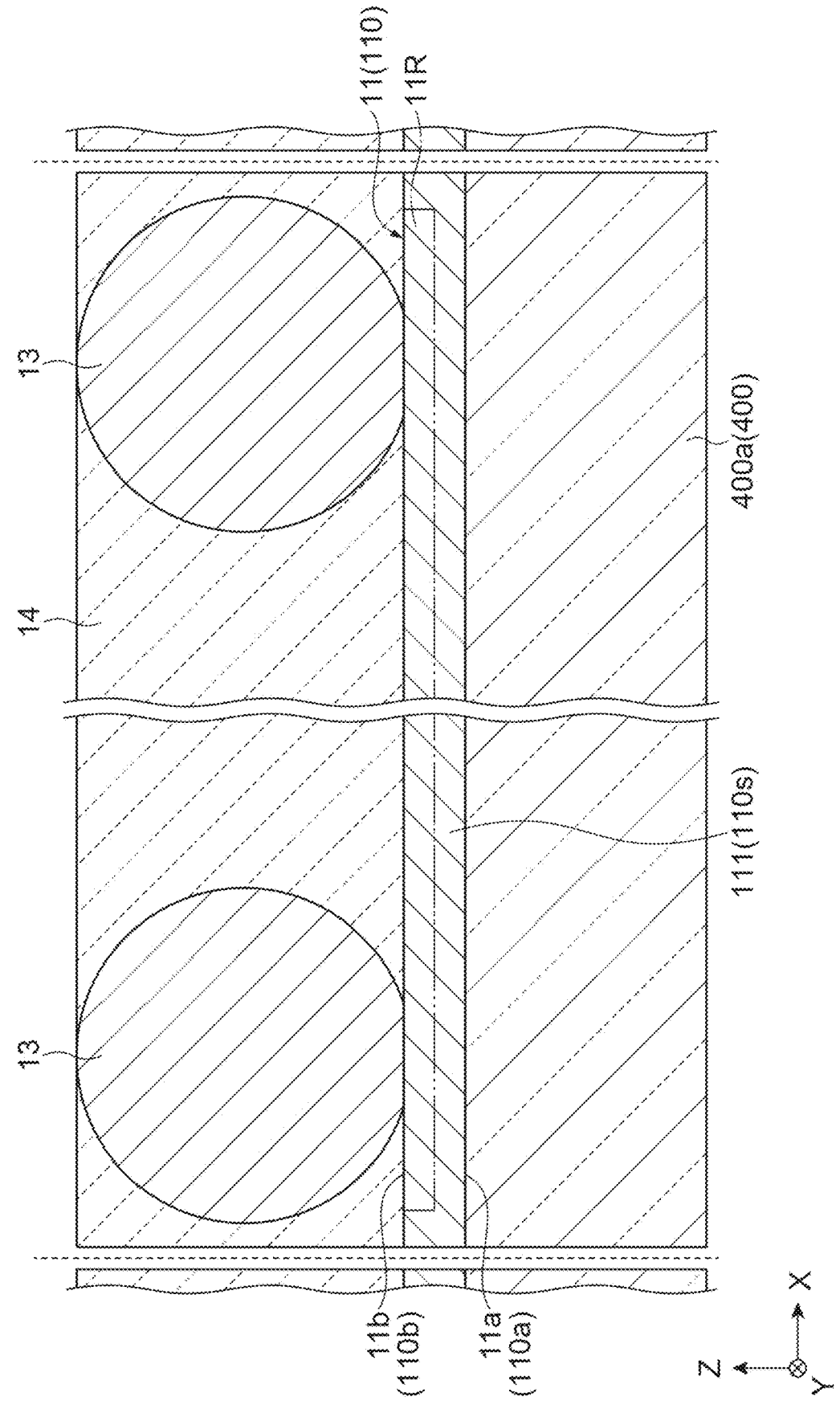
FIG. 11 is a cross-sectional view illustrating a process of the method for manufacturing the light detection device illustrated in FIG. 1.

Subsequently, as illustrated in FIG. 11, the semiconductor wafer 110 and the support substrate 400 are cut for each light receiving region 11R in a state where the support substrate 400 provided on the first main surface 110a, and the light receiving element 11 corresponding to a part of the cut semiconductor wafer 110 is obtained in a state where a support member 400a corresponding to a part of the cut support substrate 400 is provided on the back surface 11a corresponding to a part of the cut first main surface 110a (third process). As a result, a plurality of light receiving elements 11 can be obtained from the semiconductor wafer 110.

Figure 12:
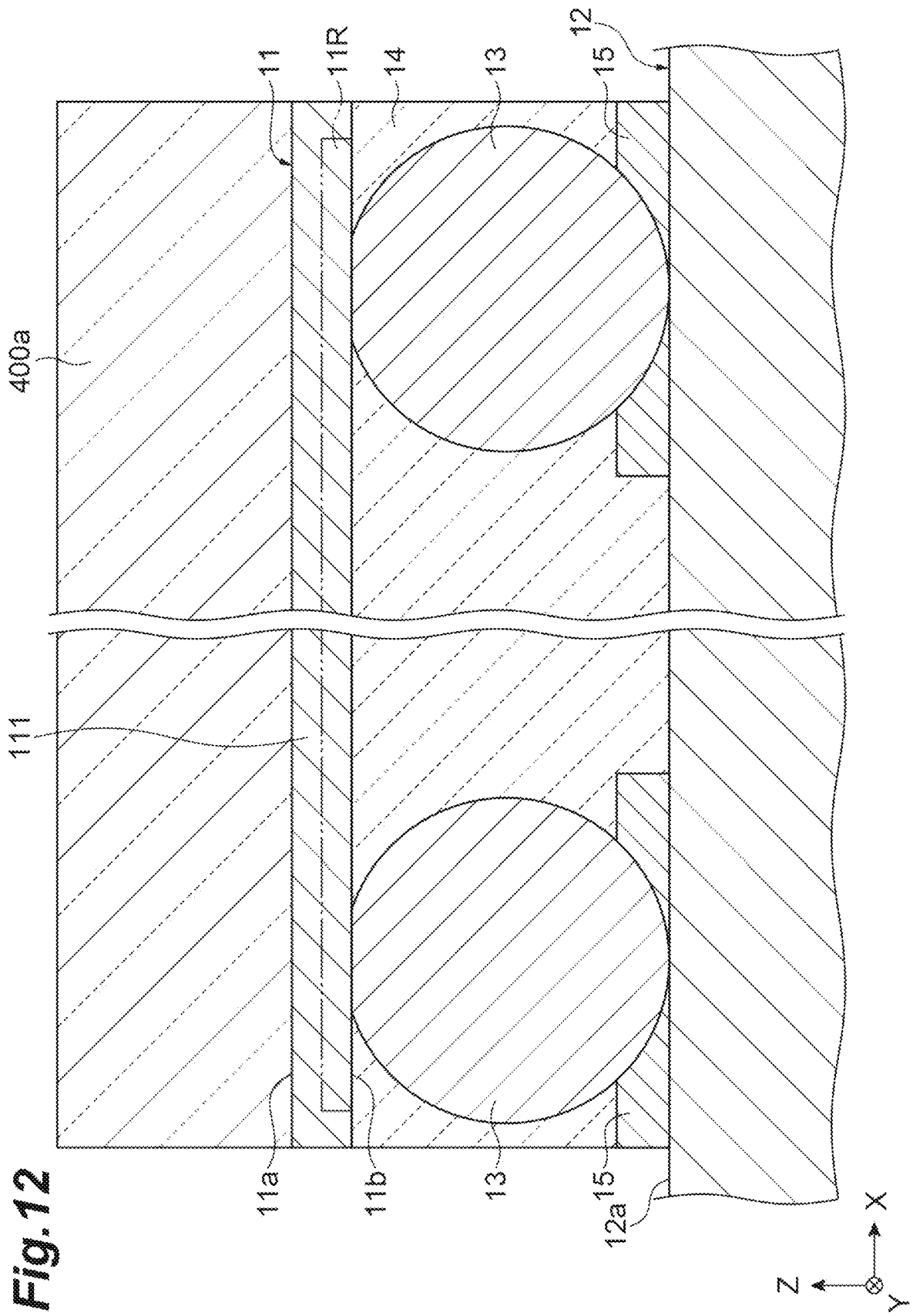
FIG. 12 is a cross-sectional view illustrating a process of the method for manufacturing the light detection device illustrated in FIG. 1.

Subsequently, as illustrated in FIG. 12, the light receiving element 11 and the circuit board 12 are electrically and physically connected in a state where the support member 400a is provided on the back surface 11a by using a plurality of bump electrodes 13 and 15 arranged between the front surface 11b corresponding to a part of the cut second main surface 110b and the mounting surface 12a of the circuit board 12 (fourth process). Note that a plurality of bump electrodes 15 is provided on the mounting surface 12a of the circuit board 12. The pair of bump electrodes 13 and 15 facing each other in the Z-axis direction are joined by pressurization and heating, so that the light receiving element 11 and the circuit board 12 are electrically and physically connected.

Figure 13:
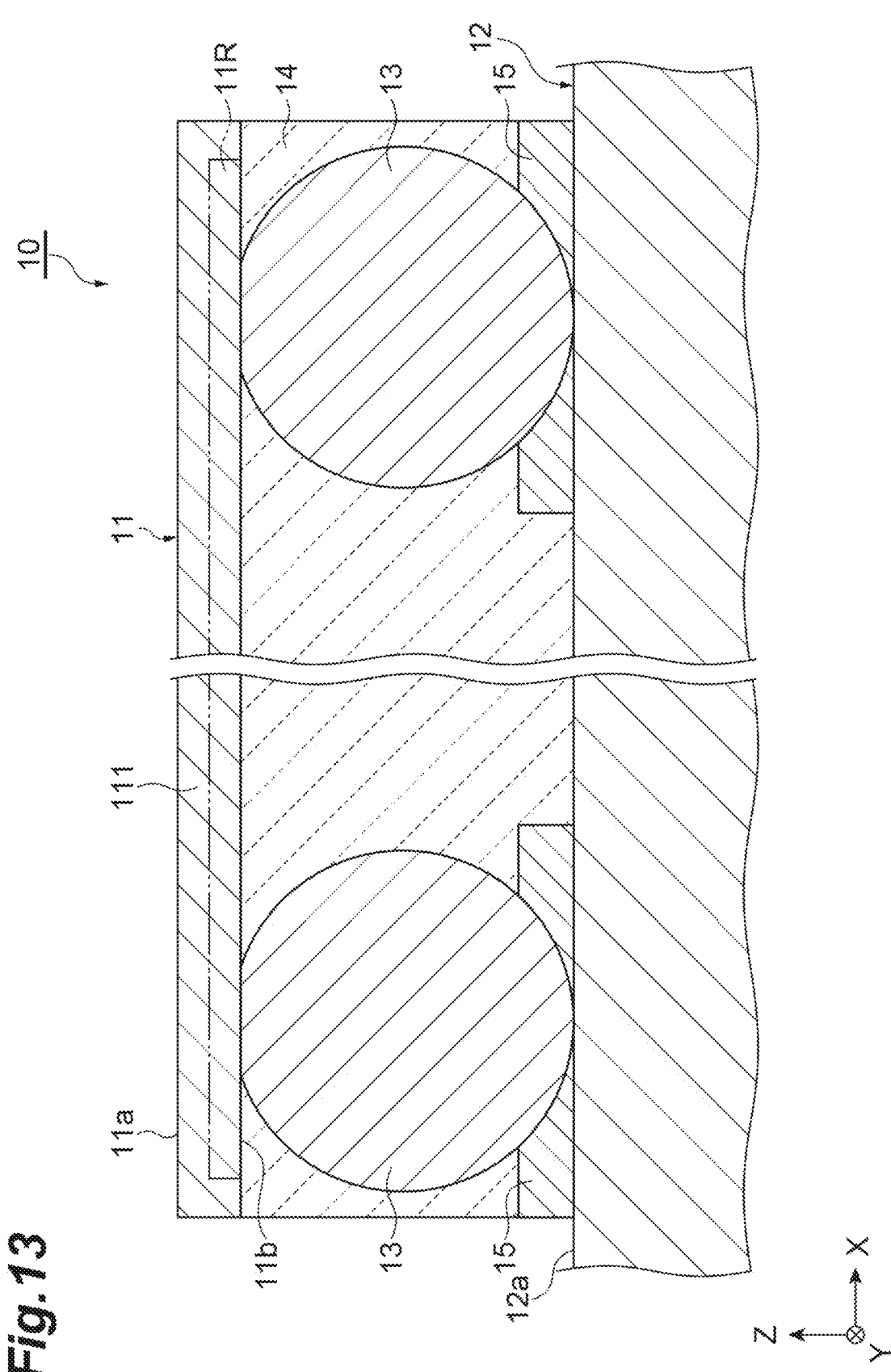
FIG. 13 is a cross-sectional view illustrating a process of the method for manufacturing the light detection device illustrated in FIG. 1.

Subsequently, as illustrated in FIG. 13, the support member 400a is removed from the back surface 11a (fifth process). The support member 400a is peeled off from the back surface 11a when the adhesive strength of the adhesive arranged between the light receiving element 11 and the support member 400a is reduced by, for example, light irradiation, heating, dissolution using a chemical solution, etc. Note that the adhesive remaining on the back surface 11a of the light receiving element 11 is removed from the back surface 11a by, for example, dissolution using a chemical solution, decomposition using a dry process, peeling using a tape, etc. From the above, the light detection device 10 is obtained.

[Action and Effect]

In the method for manufacturing the light detection device 10, the semiconductor wafer 110 and the support substrate 400 are cut for each of the plurality of light receiving regions 11R in a state where the support substrate 400 is provided on the first main surface 110a of the semiconductor wafer 110, the light receiving element 11 and the circuit board 12 are electrically and physically connected in a state where the support member 400a is provided on the back surface 11a of the light receiving element 11, and then the support member 400a is removed from the back surface 11a of the light receiving element 11. In this way, when the light receiving element 11 and the circuit board 12 are connected, the support member 400a is provided on the back surface 11a of the light receiving element 11. Therefore, even when the light receiving element 11 is thinned, it is possible to prevent the light receiving element 11 from becoming difficult to handle. Therefore, according to the method for manufacturing the light detection device 10, even when the light receiving element 11 is thinned, the light receiving element 11 and the circuit board 12 can be reliably connected to each other.

Further, in the method for manufacturing the light detection device 10, the plurality of light receiving regions 11R is arranged two-dimensionally on the second main surface 110b side with respect to the semiconductor substrate 110s included in the semiconductor wafer 110. In this way, in the light receiving element 11, the light receiving regions 11R are arranged on the circuit board 12 side with respect to the semiconductor substrate 110s, and thus it is possible to obtain the light detection device 10 including the back surface incident type light receiving element 11.

Further, in the method for manufacturing the light detection device 10, before the support substrate 400 is provided on the first main surface 110a of the semiconductor wafer 110, the support substrate 300 is provided on the second main surface 110b of the semiconductor wafer 110, and the semiconductor wafer 110 is thinned in a state where the support substrate 300 is provided on the second main surface 110b. Further, when the support substrate 400 is provided on the first main surface 110a of the semiconductor wafer 110, the support substrate 400 is provided on the first main surface 110a of the semiconductor wafer 110 in a state where the support substrate 300 is provided on the second main surface 110b, and the support substrate 300 is removed from the second main surface 110b of the semiconductor wafer 110 in a state where the support substrate 400 is provided on the first main surface 110a. In this way, the semiconductor wafer 110 can be thinned in a stable state.

Further, in the method for manufacturing the light detection device 10, in a state where the support substrate 400 provided on the first main surface 110a, the plurality of bump electrodes 13 is provided on the second main surface 110b of the semiconductor wafer 110. In this way, the plurality of bump electrodes 13 can be efficiently provided for each of the plurality of light receiving regions 11R.

Further, in the light detection device 10, the height of each of the plurality of bump electrodes 13 electrically and physically connecting the light receiving element 11 and the circuit board 12 is larger than the width of the light receiving element 11 in the direction perpendicular to the back surface 11a. In this way, even when the light receiving element 11 is thinned and the light receiving element 11 is easily deformed due to the influence of stress, static electricity, etc., the light receiving element 11 is prevented from coming into contact with the circuit board 12. Therefore, according to the light detection device 10, even when the light receiving element 11 is thinned, it is possible to prevent the light receiving element 11 from being damaged due to deformation.

Further, in the light detection device 10, the light receiving element 11 and the circuit board 12 are electrically and physically connected by the plurality of bump electrodes 13. In this way, the light receiving element 11 and the circuit board 12 can be reliably connected to each other while preventing the light receiving element 11 from coming into contact with the circuit board 12.

Further, in the light detection device 10, the underfill 14 is arranged between the front surface 11b of the light receiving element 11 and the mounting surface 12a of the circuit board 12. In this way, connection between the light receiving element 11 and the circuit board 12 can be reinforced while protecting the plurality of bump electrodes 13.

Further, in the light detection device 10, the width of the light receiving element 11 in the direction parallel to the back surface 11a is 10 times or more the width of the light receiving element 11 in the direction perpendicular to the back surface 11a. In this way, even when the light receiving element 11 is thinned and has a large area, it is possible to prevent the light receiving element 11 from being damaged due to deformation.

Second Embodiment

[Configuration of Light Detection Device]

Figure 14:
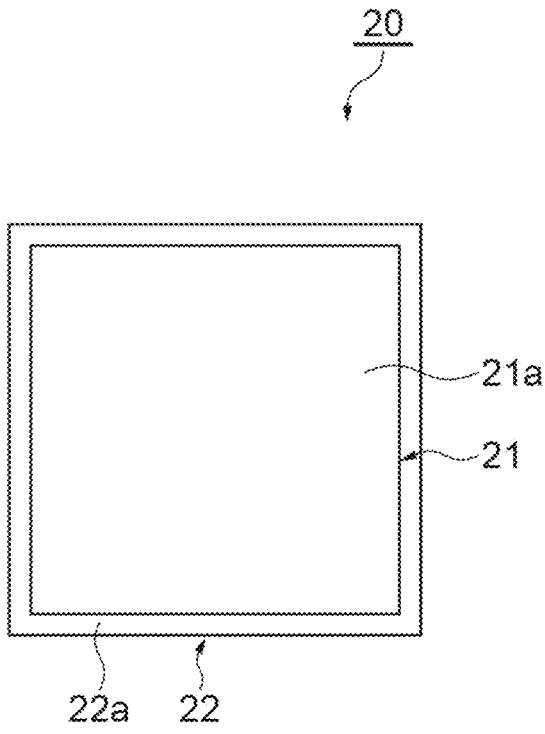
FIG. 14 is a plan view of a light detection device of a second embodiment.
Figure 14:
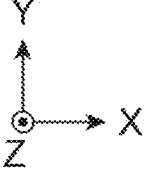
Figure 15:
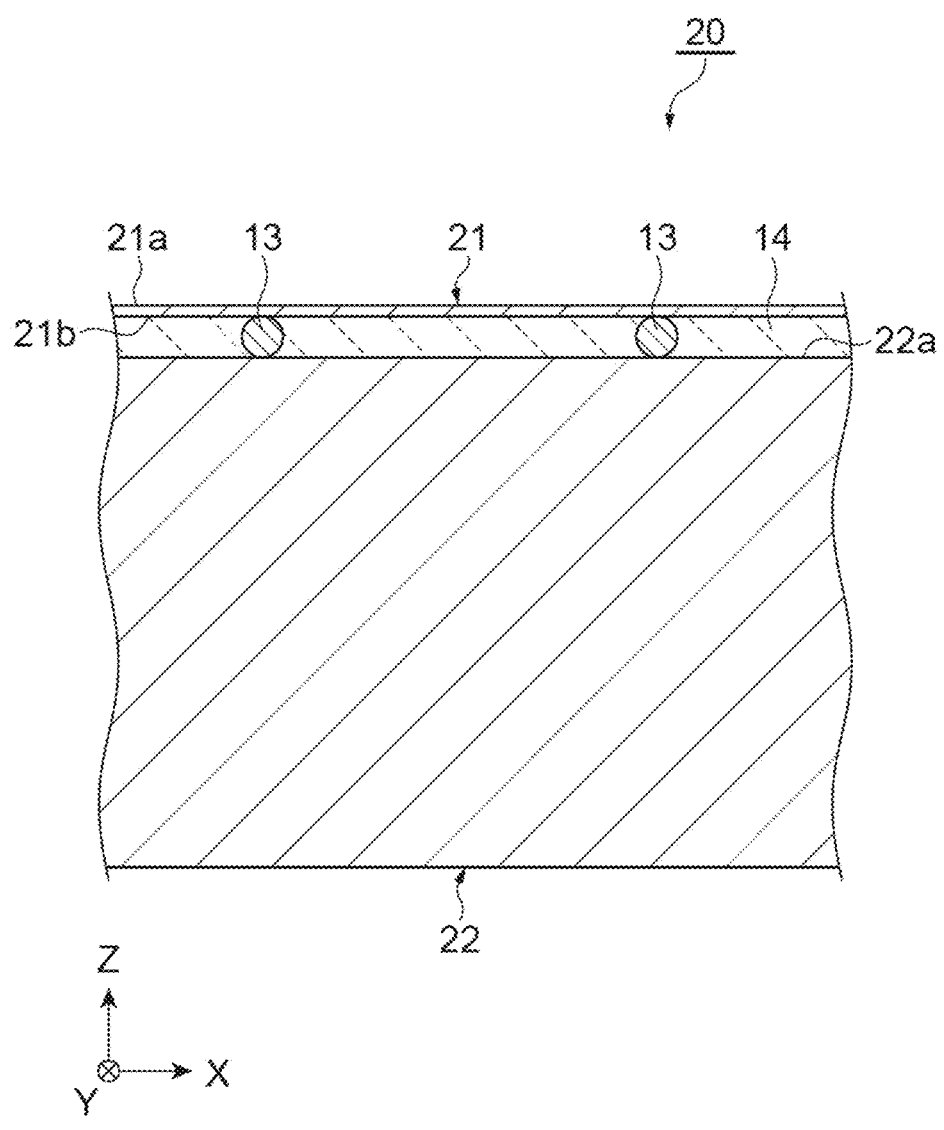
FIG. 15 is a cross-sectional view of a part of the light detection device illustrated in FIG. 14.

As illustrated in FIGS. 14 and 15, a light detection device 20 includes a light receiving element 21 and a circuit element (circuit structure) 22. The light receiving element 21 is mounted on the circuit element 22. The light receiving element 21 is a surface incident type semiconductor light receiving element. The circuit element 22 is, for example, an integrated circuit element such as an application specific integrated circuit (ASIC). For example, the light detection device 20 is included in a silicon photodiode array. In the following description, a direction of light incident on the light receiving element 21 is referred to as a Z-axis direction, a direction perpendicular to the Z-axis direction is referred to as an X-axis direction, and a direction perpendicular to the Z-axis direction and the X-axis direction is referred to as a Y-axis direction.

The light receiving element 21 has a front surface (first surface) 21a and a back surface (second surface) 21b. The back surface 21b is a surface on the opposite side from the front surface 21a. The light receiving element 21 is a surface incident type semiconductor light receiving element having the front surface 21a as a light incident surface.

For example, the light receiving element 21 is formed in a rectangular plate shape. A width of the light receiving element 21 in the direction parallel to the front surface 21a is 10 times or more a width of the light receiving element 21 in the Z-axis direction perpendicular to the front surface 21a (that is, the thickness of the light receiving element 21). Note that the width of the light receiving element 21 in the direction parallel to the front surface 21a means a minimum width among widths of the light receiving element 21 in all directions parallel to the front surface 21a. As an example, each of the width of the light receiving element 21 in the X-axis direction and the width of the light receiving element 21 in the Y-axis direction is about 5 mm, and the thickness of the light receiving element 21 is about 15 μm. In this case, the width of the light receiving element 21 in the direction parallel to the front surface 21a is about 5 mm (each of the width of the light receiving element 21 in the X-axis direction and the width of the light receiving element 21 in the Y-axis direction).

The circuit element 22 has a mounting surface 22a facing the back surface 21b of the light receiving element 21. For example, the circuit element 22 is formed in a rectangular plate shape. As an example, each of the width of the circuit element 22 in the X-axis direction and the width of the circuit element 22 in the Y-axis direction is about 6 mm, and the width of the circuit element 22 in the Z-axis direction (that is, the thickness of the circuit element 22) is about 0.7 mm.

A plurality of bump electrodes 13 is arranged between the back surface 21b of the light receiving element 21 and the mounting surface 22a of the circuit element 22. The plurality of bump electrodes 13 electrically and physically connects the light receiving element 21 and the circuit element 22 to each other. The height of each of the bump electrodes 13 (that is, the distance between the back surface 21b of the light receiving element 21 and the mounting surface 22a of the circuit element 22) is larger than the thickness of the light receiving element 21. As an example, the height of each of the bump electrodes 13 is about 40 μm. An underfill 14 is arranged between the back surface 21b of the light receiving element 21 and the mounting surface 22a of the circuit element 22. The underfill 14 surrounds each bump electrode 13 between the back surface 21b of the light receiving element 21 and the mounting surface 22a of the circuit element 22.

Figure 16:
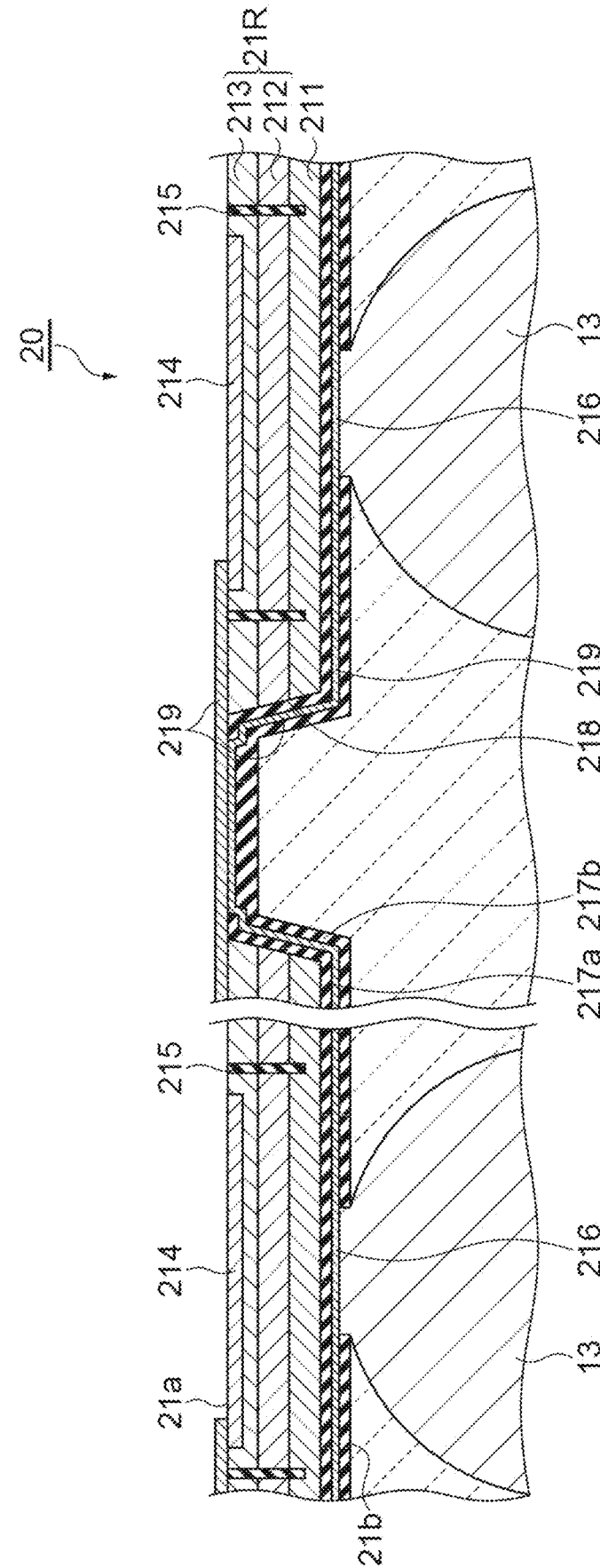
FIG. 16 is an enlarged cross-sectional view of a part of the light detection device illustrated in FIG. 14.
Figure 16:
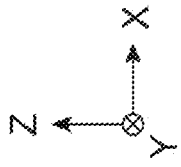

As illustrated in FIG. 16, the light receiving element 21 includes an n⁺-type semiconductor substrate 211, an n⁻-type semiconductor layer 212, a p⁻-type semiconductor layer 213, and a plurality of p⁺-type semiconductor regions 214. The semiconductor layer 212 is formed on the semiconductor substrate 211 by, for example, epitaxial growth. The semiconductor layer 213 is formed on the semiconductor layer 212 by, for example, epitaxial growth. The plurality of semiconductor regions 214 is formed in the semiconductor layer 213 by, for example, impurity diffusion. The plurality of semiconductor regions 214 is arranged two-dimensionally (for example, in a matrix shape in which the X-axis direction is a row direction and the Y-axis direction is a column direction) when viewed in the Z-axis direction. In the light receiving element 21, the semiconductor substrate 211 is located on the back surface 21b side, and the semiconductor layer 213 and the plurality of semiconductor regions 214 are located on the front surface 21a side.

In the light receiving element 21, the semiconductor layer 212 and the semiconductor layer 213 form a pn junction and are included a light receiving region 21R that functions as a photoelectric conversion region. The light receiving region 21R is located on the front surface 21a side with respect to the semiconductor substrate 211. Apart of the light receiving region 21R corresponding to each semiconductor region 214 is included in a pixel. The semiconductor substrate 211 and the semiconductor layers 212 and 213 are provided with an insulating region 215 for electrically determining the pixel. An electrode pad 216 is provided on the back surface 21b for each semiconductor region 214. Each electrode pad 216 is electrically connected to the corresponding semiconductor region 214 via a wiring 219 partially formed in a through-hole 218. The wiring 219 is covered with insulating films 217a and 217b except for an electrical connection portion. The bump electrode 13 electrically and physically connects the electrode pad 216 of the light receiving element 21 and an electrode pad (not illustrated) of the circuit element 22 facing each other in the Z-axis direction. Note that the respective conductive types of the p-type and the n-type in the light receiving element 21 may be the opposite of those described above.

[Method for Manufacturing Light Detection Device]

Figure 17:
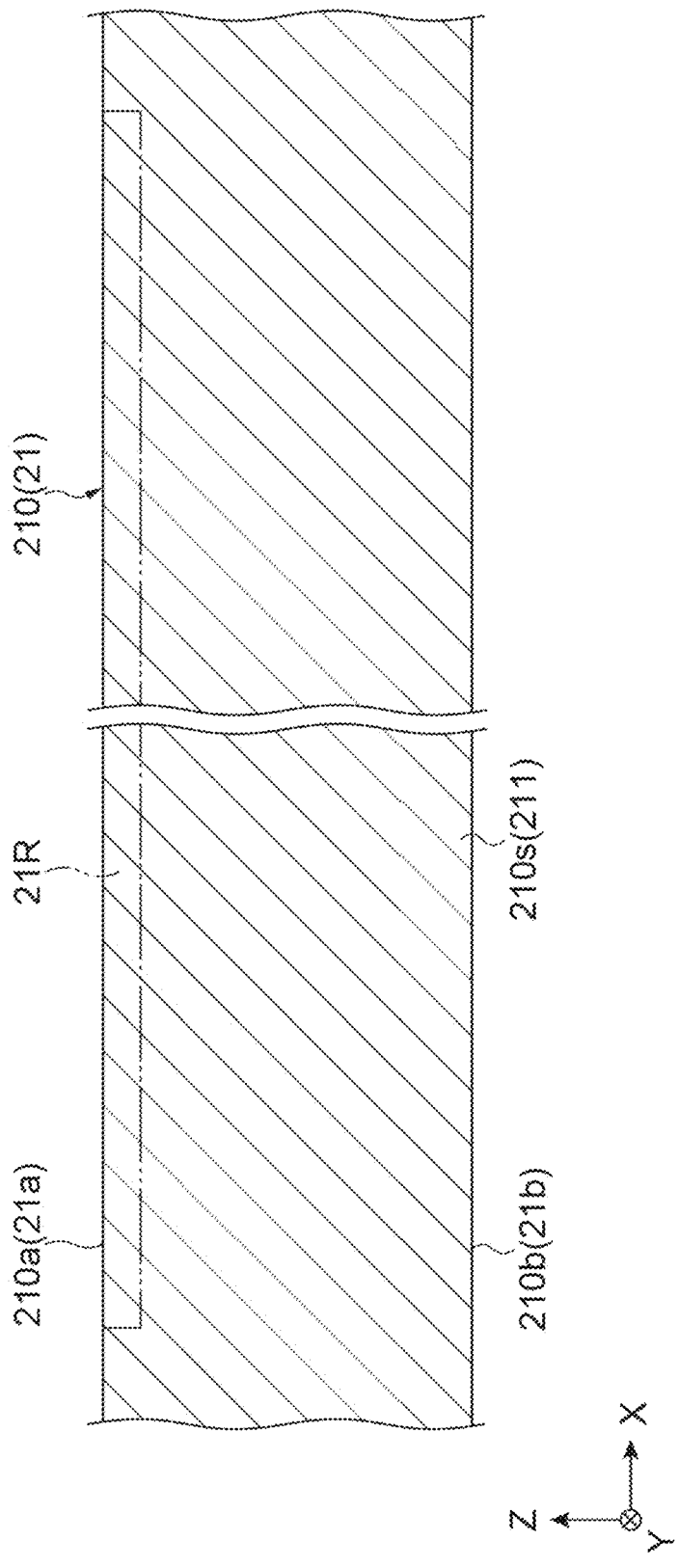
FIG. 17 is a cross-sectional view illustrating a process of a method for manufacturing the light detection device illustrated in FIG. 14.

First, as illustrated in FIG. 17, a semiconductor wafer 210 is prepared (first process). The semiconductor wafer 210 has a first main surface 210a and a second main surface 210b. The second main surface 210b is a surface on the opposite side from the first main surface 210a. The semiconductor wafer 210 includes a plurality of light receiving regions 21R. The plurality of light receiving regions 21R is arranged two-dimensionally on the first main surface 210a side with respect to the semiconductor substrate 210s included in the semiconductor wafer 210. That is, the semiconductor wafer 210 includes a plurality of light receiving elements 21 corresponding to the plurality of light receiving regions 21R, respectively.

Figure 18:
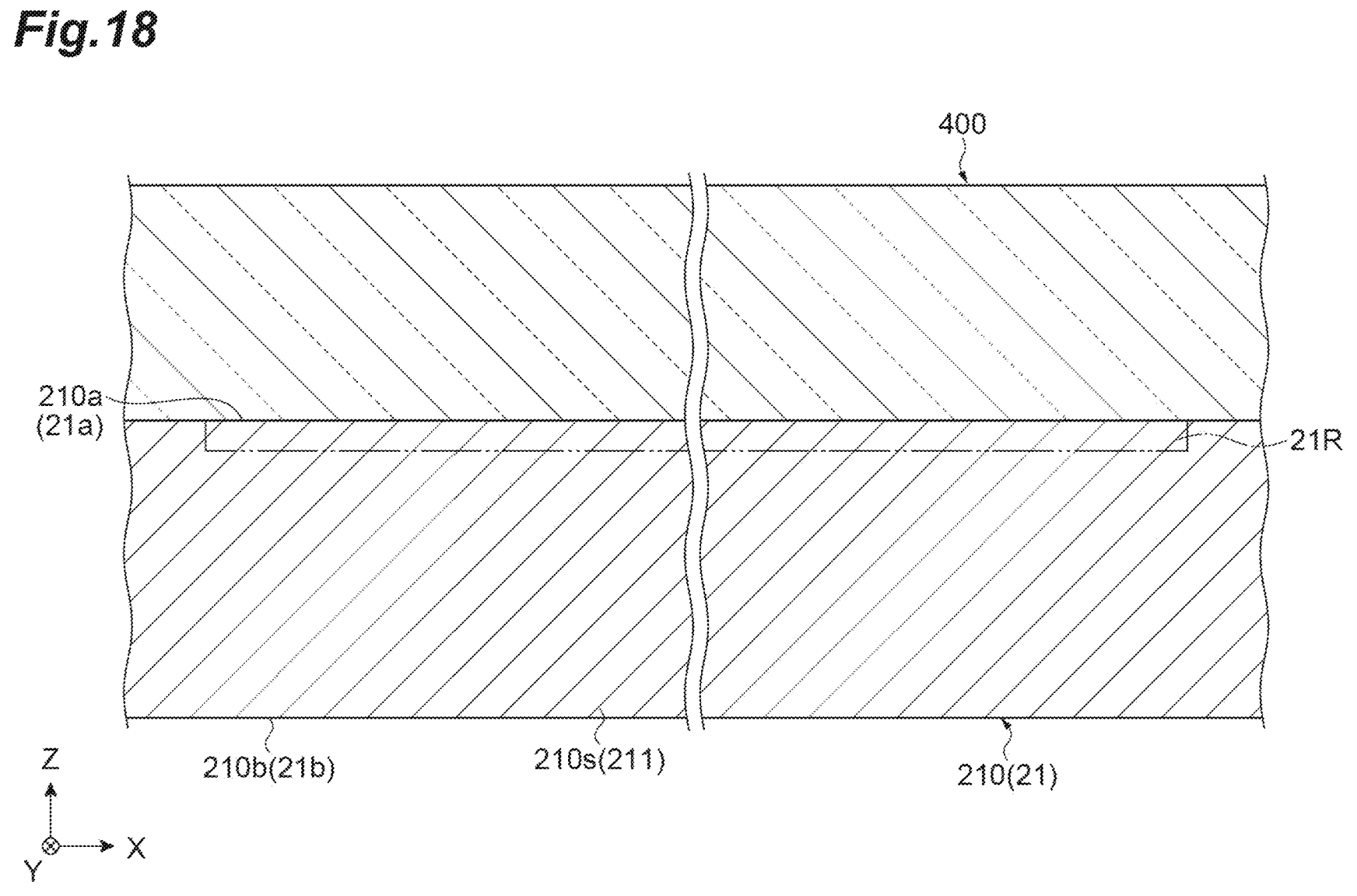

Subsequently, as illustrated in FIG. 18, the support substrate 400 is provided on the first main surface 210a of the semiconductor wafer 210 (second process). The support substrate 400 is, for example, a glass substrate. The support substrate 400 is fixed to the first main surface 210a of the semiconductor wafer 210 using, for example, an adhesive.

Figure 19:
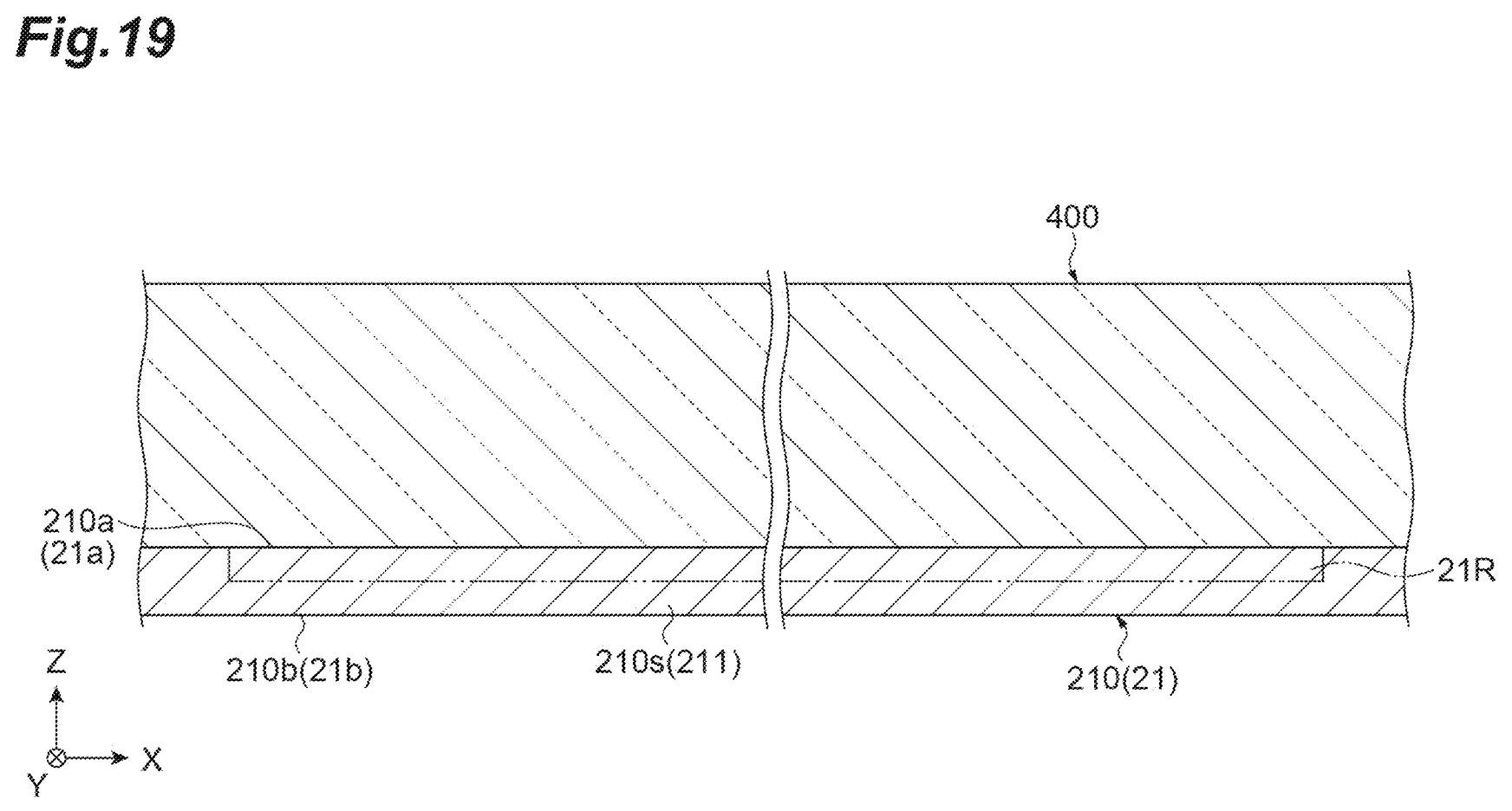

Subsequently, as illustrated in FIG. 19, the semiconductor wafer 210 is thinned in a state where the support substrate 400 is provided on the first main surface 210a (sixth process). The semiconductor wafer 210 is thinned, for example, by polishing the second main surface 210b. Subsequently, the through-hole 218, the electrode pad 216, the wiring 219, etc. are formed (not illustrated).

Figure 20:
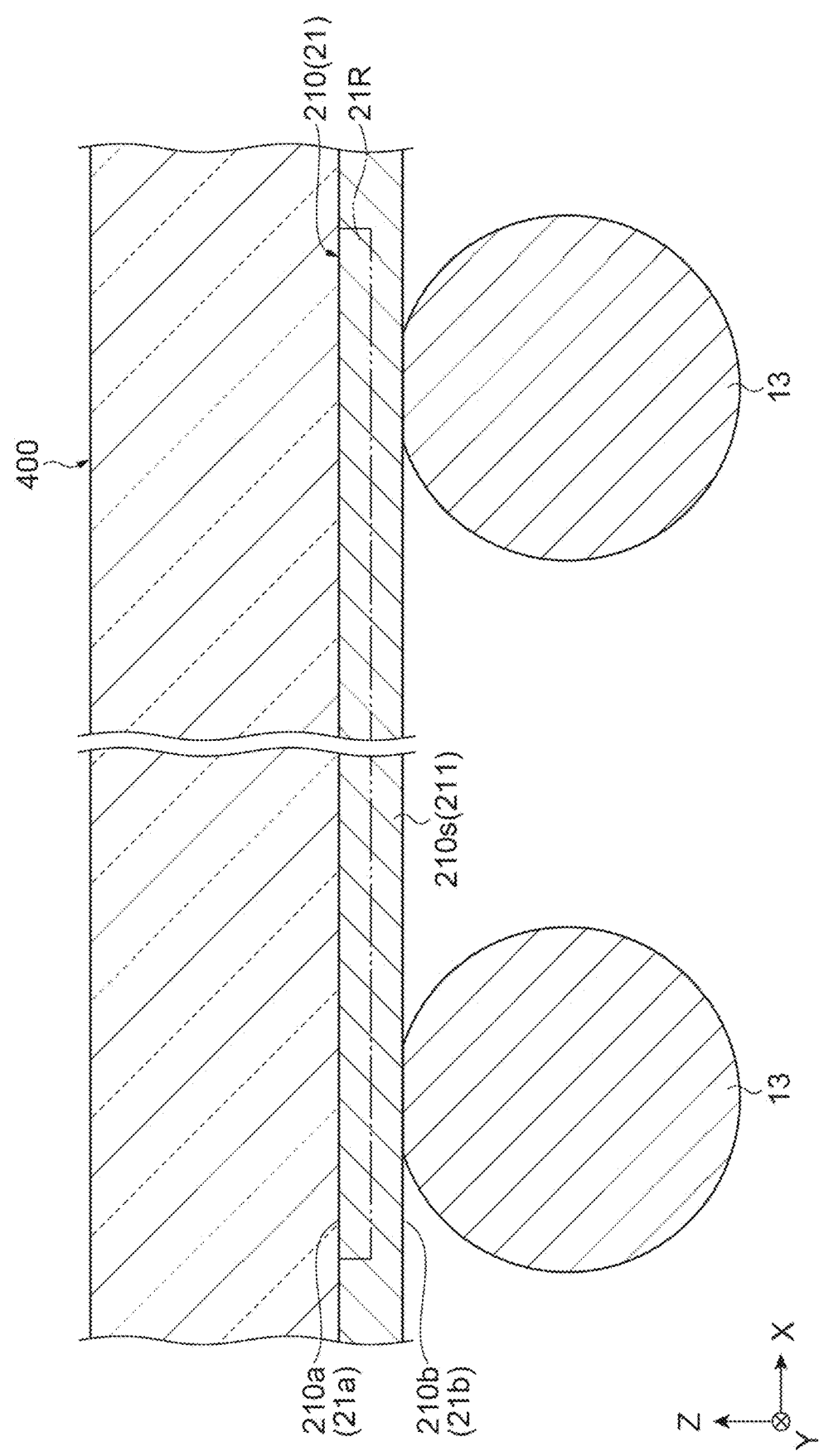
FIG. 20 is a cross-sectional view illustrating a process of the method for manufacturing the light detection device illustrated in FIG. 14.

Subsequently, as illustrated in FIG. 20, the plurality of bump electrodes 13 is provided on the second main surface 210b of the semiconductor wafer 210 (seventh process). In each light receiving region 21R, each bump electrode 13 is formed on each electrode pad 216 (see FIG. 3).

Figure 21:
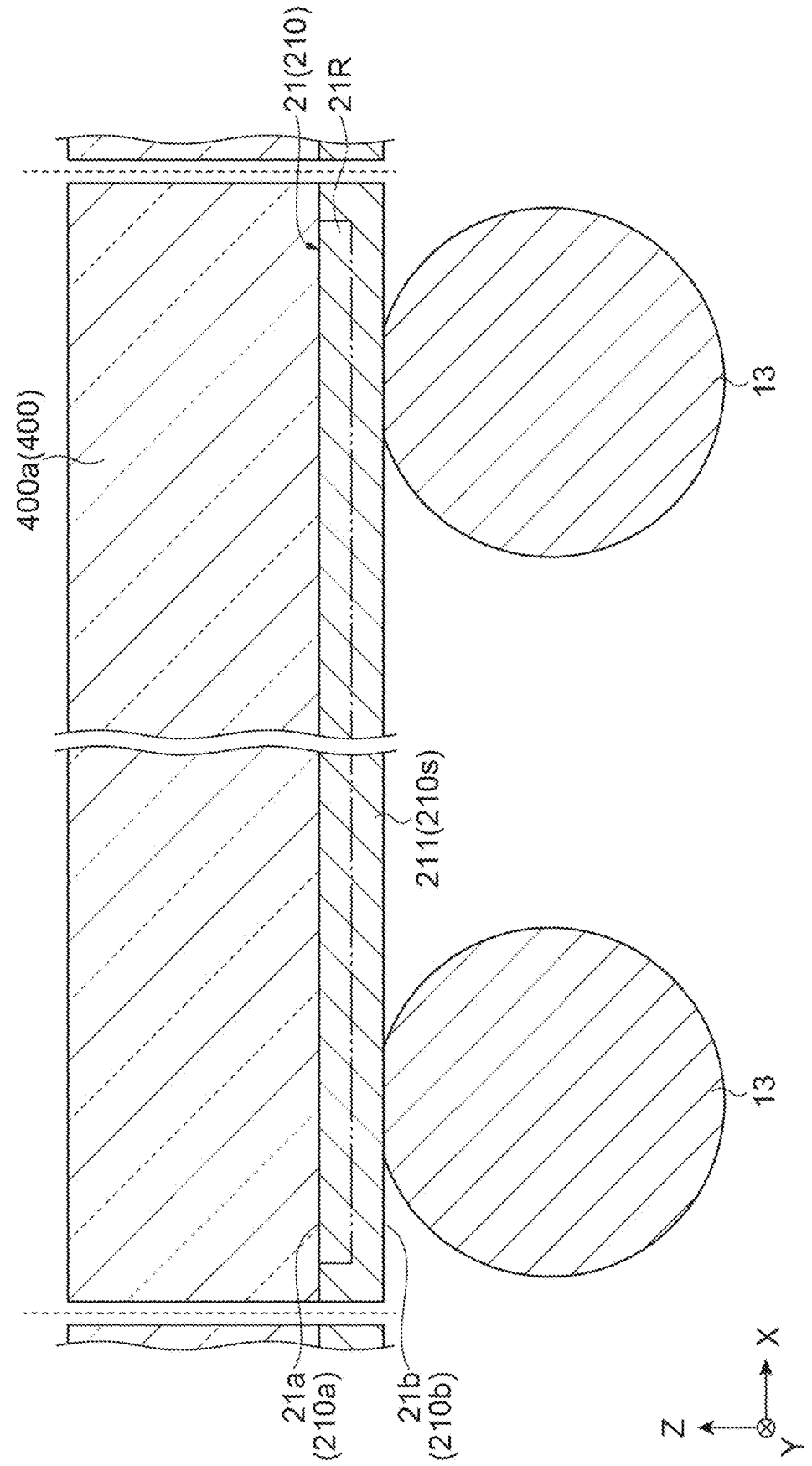
FIG. 21 is a cross-sectional view illustrating a process of the method for manufacturing the light detection device illustrated in FIG. 14.

Subsequently, as illustrated in FIG. 21, the semiconductor wafer 210 and the support substrate 400 are cut for each light receiving region 21R in a state where the support substrate 400 is provided on the first main surface 210a, and the light receiving element 21 corresponding to a part of the cut semiconductor wafer 210 is obtained in a state where the support member 400a corresponding to a part of the cut support substrate 400 is provided on the front surface 21a corresponding to a part of the cut first main surface 210a (third process). In this way, the plurality of light receiving elements 21 is obtained from the semiconductor wafer 210.

Figure 22:
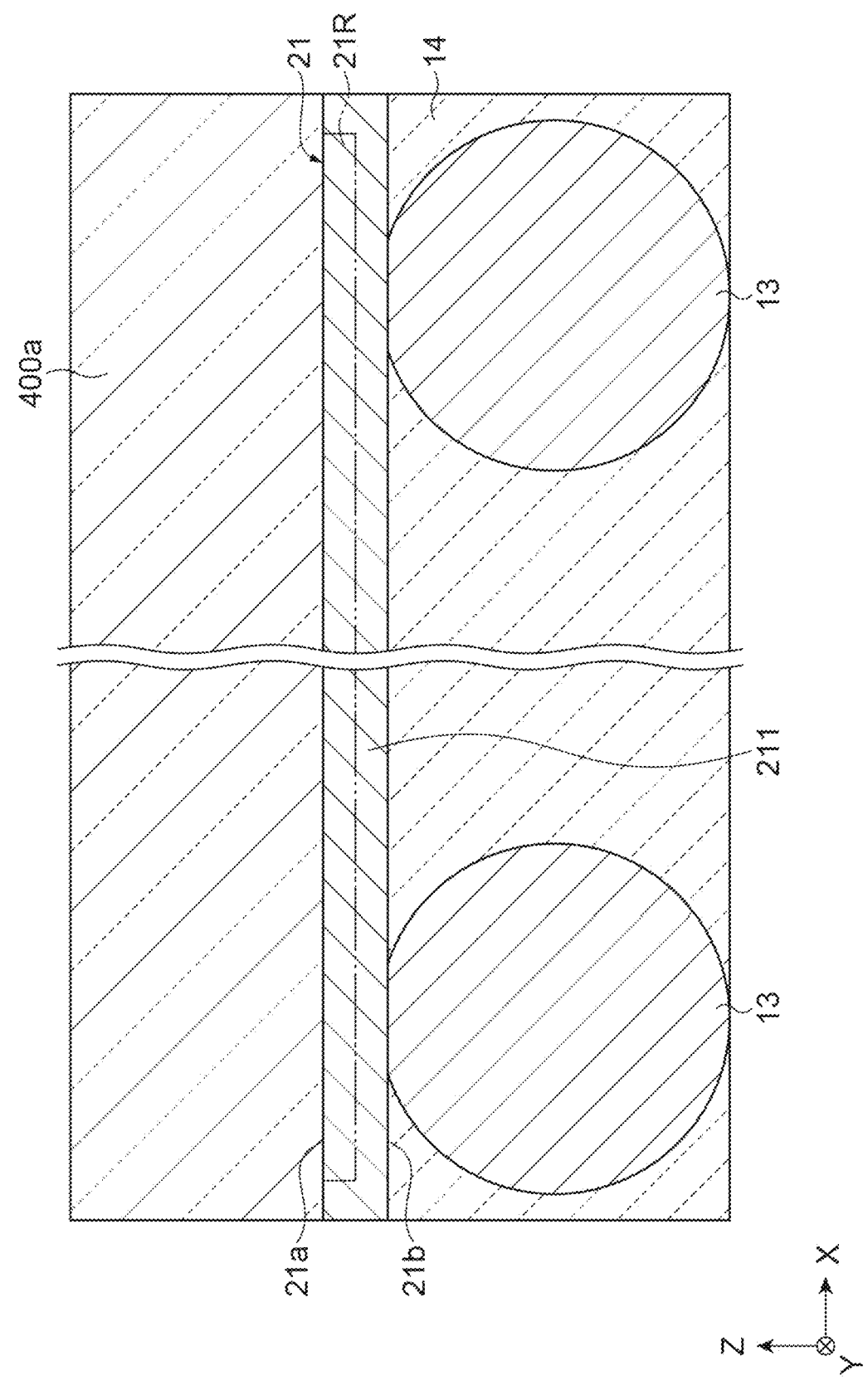
FIG. 22 is a cross-sectional view illustrating a process of the method for manufacturing the light detection device illustrated in FIG. 14.

Subsequently, as illustrated in FIG. 22, the underfill 14 is arranged on the back surface 21b so as to cover the plurality of bump electrodes 13. The underfill 14 is, for example, a film-shaped resin film.

Figure 23:
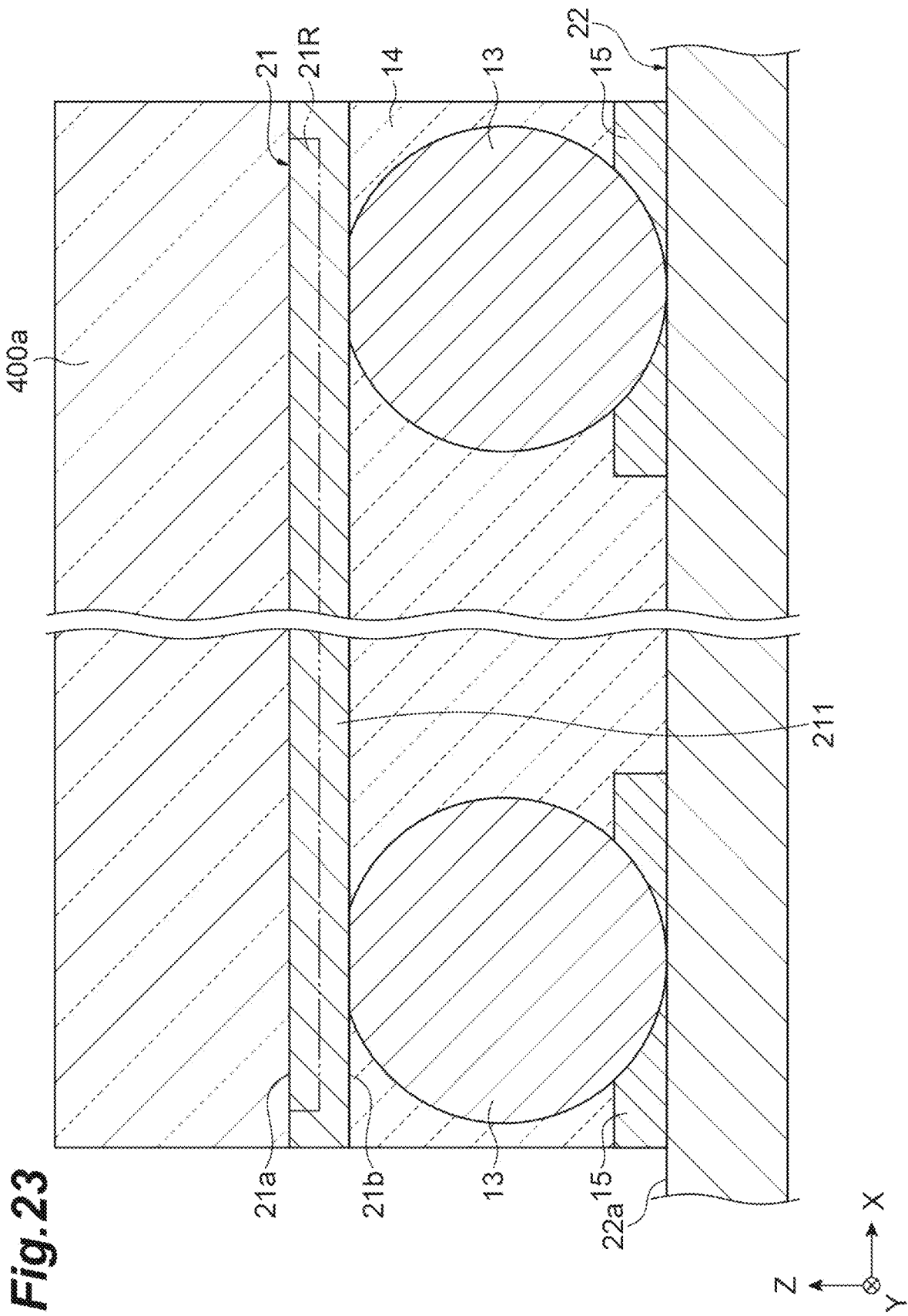
FIG. 23 is a cross-sectional view illustrating a process of the method for manufacturing the light detection device illustrated in FIG. 14.

Subsequently, as illustrated in FIG. 23, the light receiving element 21 and the circuit element 22 are electrically and physically connected to each other in a state where the support member 400a is provided on the front surface 21a by using the plurality of bump electrodes 13 and 15 arranged between the back surface 21b corresponding to a part of the cut second main surface 210b and the mounting surface 22a of the circuit element 22 (fourth process). Note that the plurality of bump electrodes 15 is provided on the mounting surface 22a of the circuit element 22. The pair of bump electrodes 13 and 15 facing each other in the Z-axis direction is joined by pressurization and heating, so that the light receiving element 21 and the circuit element 22 are electrically and physically connected to each other.

Figure 24:
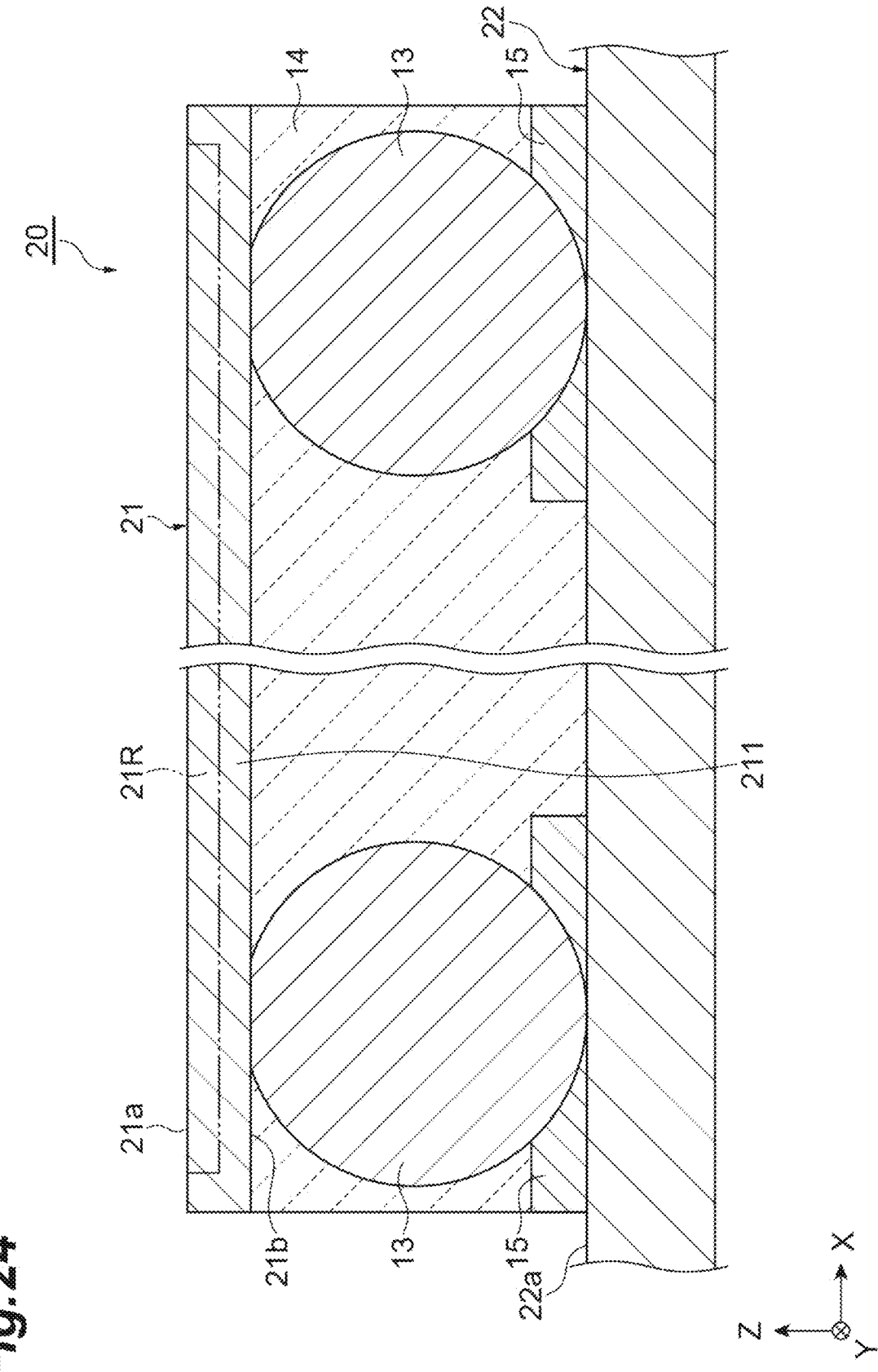
FIG. 24 is a cross-sectional view illustrating a process of the method for manufacturing the light detection device illustrated in FIG. 14.

Subsequently, as illustrated in FIG. 24, the support member 400a is removed from the front surface 21a (fifth process). The support member 400a is peeled off from the front surface 21a when the adhesive strength of the adhesive arranged between the light receiving element 21 and the support member 400a is reduced by, for example, light irradiation, heating, dissolution using a chemical solution, etc. Note that the adhesive remaining on the front surface 21a of the light receiving element 21 is removed from the front surface 21a by, for example, dissolution using a chemical solution, decomposition using a dry process, peeling using a tape, etc. From the above, the light detection device 20 is obtained.

[Action and Effect]

In the method for manufacturing the light detection device 20, the semiconductor wafer 210 and the support substrate 400 are cut for each of the plurality of light receiving regions 21R in a state where the support substrate 400 is provided on the first main surface 210a of the semiconductor wafer 210, the light receiving element 21 and the circuit element 22 are electrically and physically connected in a state where the support member 400a is provided on the front surface 21a of the light receiving element 21, and then the support member 400a is removed from the front surface 21a of the light receiving element 21. In this way, when the light receiving element 21 and the circuit element 22 are connected, the support member 400a is provided on the front surface 21a of the light receiving element 21. Therefore, even when the light receiving element 21 is thinned, it is possible to prevent the light receiving element 21 from becoming difficult to handle. Therefore, according to the method for manufacturing the light detection device 20, even when the light receiving element 21 is thinned, the light receiving element 21 and the circuit element 22 can be reliably connected to each other.

Further, in the method for manufacturing the light detection device 20, the plurality of light receiving regions 21R is arranged two-dimensionally on the first main surface 210a side with respect to the semiconductor substrate 210s included in the semiconductor wafer 210. In this way, in the light receiving element 21, the light receiving regions 21R are arranged on the opposite side from the circuit element 22 with respect to the semiconductor substrate 210s, and thus it is possible to obtain the light detection device 20 including the front surface incident type light receiving element 21.

Further, in the method for manufacturing the light detection device 20, the semiconductor wafer 210 is thinned in a state where the support substrate 400 is provided on the first main surface 210a before the semiconductor wafer 210 and the support substrate 400 are cut for each of the plurality of light receiving regions 21R. In this way, the semiconductor wafer 210 can be thinned in a stable state.

Further, in the method for manufacturing the light detection device 20, the plurality of bump electrodes 13 is provided on the second main surface 210b of the semiconductor wafer 210 in a state where the support substrate 400 provided on the first main surface 210a. In this way, the plurality of bump electrodes 13 can be efficiently provided for each of the plurality of light receiving regions 21R.

Further, in the light detection device 20, the height of each of the plurality of bump electrodes 13 that electrically and physically connects the light receiving element 21 and the circuit element 22 is larger than the width of the light receiving element 21 in the direction perpendicular to the front surface 21a. In this way, even when the light receiving element 21 is thinned and the light receiving element 21 is easily deformed due to the influence of stress, static electricity, etc., the light receiving element 21 is prevented from coming into contact with the circuit element 22. Therefore, according to the light detection device 20, even when the light receiving element 21 is thinned, it is possible to prevent the light receiving element 21 from being damaged due to deformation.

Further, in the light detection device 20, the light receiving element 21 and the circuit element 22 are electrically and physically connected by the plurality of bump electrodes 13. In this way, the light receiving element 21 and the circuit element 22 can be reliably connected while preventing the light receiving element 21 from coming into contact with the circuit element 22.

Further, in the light detection device 20, the underfill 14 is arranged between the back surface 21b of the light receiving element 21 and the mounting surface 22a of the circuit element 22. In this way, connection between the light receiving element 21 and the circuit element 22 can be reinforced while protecting the plurality of bump electrodes 13.

Further, in the light detection device 20, the width of the light receiving element 21 in the direction parallel to the front surface 21a is 10 times or more the width of the light receiving element 21 in the direction perpendicular to the front surface 21a. In this way, even when the light receiving element 21 is thinned and increased in area, it is possible to prevent the light receiving element 21 from being damaged due to deformation.

[Modification]

The present disclosure is not limited to the embodiments described above. For example, bonding between the semiconductor wafer 110 and the support substrate 300, bonding between the semiconductor wafer 110 and the support substrate 400, and bonding between the semiconductor wafer 210 and the support substrate 400 are not limited to bonding using an adhesive, and may be, for example, direct bonding, etc. Further, the support substrates 300 and 400 are not limited to the glass substrate, and may be, for example, a silicon substrate, etc. As an example, when the support substrate 300, which is a silicon substrate, is bonded to the semiconductor wafer 110 by direct bonding, the support substrate 300 may be removed from the semiconductor wafer 110 by dissolving the support substrate 300 through a dry process (gas), which is similarly applied to the support substrate 400.

In the method for manufacturing each of the light detection devices 10 and 20, the timing of arranging the underfill 14 can be appropriately selected. That is, before cutting each of the semiconductor wafers 110 and 210, the film-shaped underfill 14 may be arranged on each of the semiconductor wafers 110 and 210, or the film-shaped underfill 14 may be arranged on the circuit board 12 or the circuit element 22. Further, before cutting each of the semiconductor wafers 110 and 210, the film-shaped underfill 14 may be arranged on each of the light receiving element 11 and 21, or the film-shaped underfill 14 may be arranged on the circuit board 12 or the circuit element 22. Further, a space between the light receiving element 11 and the circuit board 12 may be filled with the liquid underfill 14 after mounting the light receiving element 11 on the circuit board 12 to cure the underfill, or a space between the light receiving element 21 and the circuit element 22 may be filled with the liquid underfill 14 after mounting the light receiving element 21 on the circuit element 22 to cure the underfill. These processes may be performed before or after removing the support member 400a from each of the light receiving elements 11 and 21.

Note that the method for manufacturing the light detection device of the present disclosure is not limited to manufacturing a light detection device in which the height of each of the plurality of bump electrodes 13 is larger than the width of the light receiving element 11 in the direction perpendicular to the back surface 11a, and a light detection device in which the height of each of the plurality of bump electrodes 13 is larger than the width of the light receiving element 21 in the direction perpendicular to the front surface 21a.

Further, in the light detection device 10, the light receiving region 11R may include a single light receiving channel or a plurality of light receiving channels, and the light receiving element 11 may be, for example, a light receiving element such as a silicon photomultiplier (SiPM) in which a plurality of avalanche photodiodes is connected in parallel. Further, in the light detection device 10, the height of each of the plurality of bump electrodes 13 may be twice or more (or 2.5 times or more) the width of the light receiving element 11 in the direction perpendicular to the back surface 11a. In this way, even when the light receiving element 11 is thinned, it is possible to more reliably prevent the light receiving element 11 from coming into contact with the circuit board 12. Similarly, in the light detection device 20, the height of each of the plurality of bump electrodes 13 may be five times or more the width of the light receiving element 21 in the direction perpendicular to the front surface 21a. In this way, even when the light receiving element 21 is thinned, it is possible to more reliably prevent the light receiving element 21 from coming into contact with the circuit element 22. Further, the bump electrode 13 may be, for example, a protruding electrode such as an Au bump, a solder bump, or a Cu pillar. Further, as the connecting member other than the bump electrode 13, for example, an anisotropic conductive film, an anisotropic conductive paste, etc. may be used. Furthermore, by combining these connection members, an electrical and physical connection between the light receiving element 11 and the circuit board 12 and an electrical and physical connection between the light receiving element 21 and the circuit element 22 may be implemented. Further, the connection member of the present disclosure may include only the bump electrode 13 provided on the light receiving element 11 or the light receiving element 21 side, include only the bump electrode 15 provided on the circuit board 12 or the circuit element 22 side, or include the bump electrode 13 and the bump electrode 15 bonded to each other.

Various materials and shapes can be applied to each configuration in the embodiments described above without being limited to the materials and shapes described above. Further, each configuration in one embodiment or modification described above can be arbitrarily applied to each configuration in another embodiment or modification.

REFERENCE SIGNS LIST

10: light detection device, 11: light receiving element, 11a: back surface (first surface), 11b: front surface (second surface), 11R: light receiving region, 12: circuit board (circuit structure), 12a: mounting surface, 13: bump electrode (connection member), 14: underfill, 20: light detection device, 21: light receiving element, 21a: front surface (first surface), 21b: back surface (second surface), 21R: light receiving region, 22: circuit element (circuit structure), 22a: mounting surface, 110: semiconductor wafer, 110a: first main surface, 110b: second main surface, 110s: semiconductor substrate, 210: semiconductor wafer, 210a: first main surface, 210b: second main surface, 210s: semiconductor substrate, 300: support substrate (second support substrate), 400: support substrate (first support substrate), 400a: support member.

The invention claimed is:

1. A method for manufacturing a light detection device, the method comprising:

a first process of preparing a semiconductor wafer having a first main surface and a second main surface on an opposite side from the first main surface, the semiconductor wafer including a plurality of light receiving regions two-dimensionally arranged;

a second process of providing a first support substrate on the first main surface after the first process;

a third process of cutting the semiconductor wafer and the first support substrate for each of the plurality of light receiving regions in a state where the first support substrate is provided on the first main surface, and obtaining a light receiving element corresponding to a part of the cut semiconductor wafer in a state where a support member corresponding to a part of the cut first support substrate is provided on a first surface corresponding to a part of the cut first main surface, after the second process;

a fourth process of, by using a plurality of connection members arranged between a second surface corresponding to a part of the cut second main surface and a mounting surface of a circuit structure, electrically and physically connecting the light receiving element and the circuit structure in a state where the support member is provided on the first surface, after the third process;

a process of providing the plurality of connection members on the second main surface or the second surface before the fourth process;

a process of arranging a film-shaped resin film on the second main surface or the second surface so as to cover the plurality of connection members from the side opposite to the second main surface or the second surface with respect to the plurality of connection members, after the process of providing the plurality of connection members and before the fourth process, wherein the film-shaped resin film covers the plurality of connection members and has a thickness greater than a thickness of the light receiving element; and a fifth process of removing the support member from the first surface after the fourth process.

2. The method for manufacturing the light detection device according to claim 1, wherein the plurality of light receiving regions is arranged two-dimensionally on a side of the second main surface with respect to a semiconductor substrate included in the semiconductor wafer.

3. The method for manufacturing the light detection device according to claim 2, further comprising:

a sixth process of providing a second support substrate on the second main surface after the first process and before the second process; and a seventh process of thinning the semiconductor wafer in a state where the second support substrate is provided on the second main surface after the sixth process and before the second process, wherein in the second process, the first support substrate is provided on the first main surface in a state where the second support substrate is provided on the second main surface, and the second support substrate is removed from the second main surface in a state where the first support substrate is provided on the first main surface.

4. The method for manufacturing the light detection device according to claim 3, further comprising an eighth process of providing a plurality of bump electrodes as the plurality of connection members on the second main surface after the second process and before the third process.

5. The method for manufacturing the light detection device according to claim 1, wherein the plurality of light receiving regions is arranged two-dimensionally on a side of the first main surface with respect to a semiconductor substrate included in the semiconductor wafer.

6. The method for manufacturing the light detection device according to claim 5, further comprising a sixth process of thinning the semiconductor wafer in a state where the first support substrate is provided on the first main surface after the second process and before the third process.

7. The method for manufacturing the light detection device according to claim 6, further comprising a seventh process of providing a plurality of bump electrodes as the plurality of connection members on the second main surface after the sixth process and before the third process.

8. A light detection device comprising:

a light receiving element having a first surface and a second surface on an opposite side from the first surface, and provided with a light receiving region;

a circuit structure having a mounting surface;

a plurality of connection members arranged between the second surface and the mounting surface to electrically and physically connect the light receiving element and the circuit structure; and an underfill arranged between the second surface and the mounting surface, wherein a thickness of the underfill in a direction perpendicular to the first surface is larger than a width of the light receiving element in the direction perpendicular to the first surface, wherein a height of each of the plurality of connection members is larger than the width of the light receiving element in the direction perpendicular to the first surface, wherein the mounting surface of the circuit structure is wider than an area where the plurality of connection members are arranged on the second surface of the light receiving element, and wherein the light receiving element has a through-hole with a wiring formed on the inside of the through-hole, and the width of the through-hole along the second surface is larger than the width of the light receiving element in the direction perpendicular to the first surface.

9. The light detection device according to claim 8, wherein the height of each of the plurality of connection members is twice or more the width of the light receiving element in the direction perpendicular to the first surface.

10. The light detection device according to claim 8, wherein the height of each of the plurality of connection members is five times or more the width of the light receiving element in the direction perpendicular to the first surface.

11. The light detection device according to claim 8, wherein the plurality of connection members is a plurality of bump electrodes.

12. The light detection device according to claim 8, wherein a width of the light receiving element in a direction parallel to the first surface is 10 times or more the width of the light receiving element in the direction perpendicular to the first surface.

* * * * *